United States Patent
Glock et al.

(10) Patent No.: US 9,306,507 B2
(45) Date of Patent: Apr. 5, 2016

(54) CONTROLLER AND METHOD FOR CONTROLLING A SIGNAL PROCESSOR

(71) Applicant: Intel Mobile Communications GmbH, Neubiberg (DE)

(72) Inventors: Stefan Glock, Nuremberg (DE); Bernhard Sogl, Unterhaching (DE); Jan-Erik Mueller, Ottobrunn (DE)

(73) Assignee: Intel Deutschland GmbH, Neubiberg (DE)

( * ) Notice: Subject to any disclaimer, the term of this patent is extended or adjusted under 35 U.S.C. 154(b) by 151 days.

(21) Appl. No.: 13/940,682

(22) Filed: Jul. 12, 2013

(65) Prior Publication Data

US 2015/0015327 A1 Jan. 15, 2015

(51) Int. Cl.
*H04B 15/00* (2006.01)
*H03F 1/32* (2006.01)
*H03F 3/19* (2006.01)

(52) U.S. Cl.
CPC ............ *H03F 1/3258* (2013.01); *H03F 1/3247* (2013.01); *H03F 3/19* (2013.01); *H03F 2200/451* (2013.01); *H03F 2201/3233* (2013.01)

(58) Field of Classification Search
CPC ......... H04L 5/00; H04L 15/00; H04L 27/367; H04B 15/00; H03F 1/3241
USPC .................. 375/284–285, 295–297
See application file for complete search history.

(56) References Cited

U.S. PATENT DOCUMENTS

| | | | | |
|---|---|---|---|---|
| 5,770,971 | A * | 6/1998 | McNicol | 330/52 |
| 6,246,286 | B1 * | 6/2001 | Persson | 330/149 |
| 7,215,716 | B1 * | 5/2007 | Smith | 375/296 |
| 7,877,060 | B1 * | 1/2011 | Khlat et al. | 455/63.1 |
| 7,962,108 | B1 * | 6/2011 | Khlat et al. | 455/114.3 |
| 8,009,762 | B1 * | 8/2011 | Al-Qaq et al. | 375/296 |
| 8,081,710 | B2 * | 12/2011 | Carey | 375/296 |
| 8,081,711 | B2 * | 12/2011 | Lee et al. | 375/296 |
| 8,170,507 | B2 * | 5/2012 | Wang et al. | 455/114.3 |
| 8,179,993 | B2 * | 5/2012 | Saed | 375/296 |
| 8,489,042 | B1 * | 7/2013 | Hietala | 455/114.3 |
| 8,625,714 | B2 * | 1/2014 | Epifano | 375/296 |
| 8,654,889 | B2 * | 2/2014 | Kumar | 375/296 |
| 8,737,526 | B2 * | 5/2014 | Coan et al. | 375/297 |
| 8,976,895 | B2 * | 3/2015 | Sombrin et al. | 375/296 |
| 2012/0263256 | A1 * | 10/2012 | Waheed et al. | 375/296 |
| 2013/0257531 | A1 * | 10/2013 | Tanio | 330/149 |

(Continued)

OTHER PUBLICATIONS

P. M. Lavrador, T. R. Cunha, P. M. Cabral, and J. C. Pedro, "The Linearity-Efficiency Compromise," IEEE Microwave Magazine, vol. 11, No. 5, pp. 44-58, 2010.

(Continued)

*Primary Examiner* — Emmanuel Bayard
(74) *Attorney, Agent, or Firm* — Eschweiler & Associates, LLC

(57) ABSTRACT

A controller for controlling a signal processor includes a transformation unit and a control unit. The transformation unit is configured to generate at least one amplitude-modulation-to-phase-modulation-distortion within a signal, output by using the signal processor according to a signal processing, based on generated at least one amplitude-modulation-to-amplitude-modulation-distortion of the signal. The control unit is configured to adjust the signal processing of the signal processor so as to minimize the at least one amplitude-modulation-to-phase-modulation-distortion.

24 Claims, 19 Drawing Sheets

(56) References Cited

U.S. PATENT DOCUMENTS

| | | | | |
|---|---|---|---|---|
| 2013/0336422 A1* | 12/2013 | Sombrin et al. | | 375/297 |
| 2014/0159810 A1* | 6/2014 | Kim | | 330/149 |
| 2014/0187182 A1* | 7/2014 | Yan et al. | | 455/115.1 |

OTHER PUBLICATIONS

F. M. Ghannouchi and 0. Hammi, "Behavioral Modeling and Predistortion: Microwave Magazine, IEEE," Microwave Magazine, IEEE, vol. 10, No. 7, pp. 52-64, 2009.

M. Honkanen and S.-G. Haeggman, "New Aspects on Nonlinear Power Amplifier Modeling in Radio Communication System Simulations," The 8th IEEE International Symposium on Personal, Indoor and Mobile Radio Communications, vol. 3, No. 3, pp. 844-848, 1997.

M. Honkanen, 0. Pollanen, J. Tanskanen, E. Jarvinen, and S.-G. Haggman, "Comparison of Measured and Simulated n:/4-DQPSK Adjacent Channel Power using a Functional High Power Amplifier Model," 48th IEEE Vehicular Technology Conference, vol. 3, pp. 2459-2463, 1998.

G. P. White, A. G. Burr, and T. Javomik, "Modelling of Nonlinear Distortion in Broadband Fixed Wireless Access Systems," Electronics Letters, vol. 39, No. 8, pp. 686-687, 2003.

A. Ghorbani and M. Sheikhan, "The Effect of Solid State Power Amplifiers (SSPAs) Nonlinearities on MPSK and M-QAM Signal Transmission," Sixth International Conference on Digital Processing of Signals in Communications, pp. 193-197, 1991.

A. J. Cann, "Nonlinearity Model with Variable Knee Sharpness," IEEE Transactions on Aerospace and Electronic Systems, vol. 16, No. 6, pp. 874-877, 1980.

A. J. Cann, "Improved Nonlinearity Model with Variable Knee Sharpness," IEEE Transactions on Aerospace and Electronic Systems, vol. 48, No. 4, pp. 3637-3646, 2012.

C. Dudak and N. D. Kahyaoglu, "A Descriptive Study on AM-AM and AM-PM Conversion Phenomena Through EVM-SNR Relation," IEEE Topical Conference on Power Amplifiers for Wireless and Radio Applications (PAWR), pp. 69-72, 2012.

C. Rapp, "Effects of HPA-Nonlinearity on a 4-DPSK/OFDM-Signal for a Digital Sound Broadcasting System," Second European Conference on Satellite Communications, pp. 179-184, 1991.

Pedro M. Cabral, et al. "Dynamnic AM-AM and AM-PM Behavior in Microwave PA Circuits." IEEE APMC Proceedings, 2005.

Wen An Tsou, et al. "Analysis and Compensation of the AM-AM and AM-PM Distortion for CMOS Cascode Class-E Power Amplifier." Hindawi Publishing Corporation, International Journal of Microwave Science and Technology, vol. 2009, pp. 1-9, 2009.

* cited by examiner

CONTROLLER AND METHOD FOR CONTROLLING A SIGNAL PROCESSOR

FIELD

Implementations of the present disclosure refer to a controller for controlling a signal processor, a mobile communication device comprising such a controller and to a method for controlling a signal processor.

BACKGROUND

A transceiver (i.e. transmitter and/or receiver), for example, a transceiver of a mobile communication device, typically comprises a signal processor, a power amplifier (PA) and a predistortion element of a power amplifier. In modern RF (Radio Frequency) transceiver systems, the reduction of current consumption is one of the most important design targets. The main sink of current in the transceiver chain is still the power amplifier, where much effort is spent in hardware design to achieve an acceptable compromise between current consumption and linearity over changing (environmental) conditions, e.g. temperature, frequency, load impedance. To further reduce the PA current consumption, the trend goes towards the implementation of adaptive (software) algorithms, which can overcome certain hurdles in hardware design. Examples for these algorithms are digital predistortion to increase the linear output power range, bias point adjustment to adapt the linearity according to the specification, or envelope tracking to adjust the power amplifier supply voltage with respect to the envelope of the input signal. The main target of such algorithms is to make use of the linearity-current trade-off and bring the PA as close as possible to the specification limit and to thus minimize the battery current.

The limited linearity of the PA causes so called amplitude-modulation-to-amplitude-modulation distortions (AM/AM-distortions) and so called amplitude-modulation-to-phase-modulation distortions (AM/PM-distortions). These AM/AM- and AM/PM-distortions are major concerns because they are responsible for intermodulation (IM) components and spectral regrowth. This may cause additional channel interferences to other communication channels. Additionally, effects of AM/AM- and AM/PM-distortions may cause in-band distortions that degrade the error vector magnitude (EVM).

SUMMARY

Implementations of the present disclosure include a controller for controlling a signal processor, which comprises a transformation unit configured to generate at least one AM/PM-distortion within a signal, using the signal processor according to a signal processing, based on generated at least one AM/AM-distortion of the signal. The controller further comprises a control unit configured to adjust the signal processing of the signal processor so as to minimize the at least one AM/PM-distortion.

Another implementation refers to a controller for controlling a signal processor. The controller comprises a transformation unit, a control unit and at least a sensor for determining one or more current environmental conditions. The transformation unit is configured to generate at least one AM/PM-distortion within a signal, output by using the signal processor according to a signal processing, based on detected or generated at least one AM/AM-distortion of the signal. The control unit is configured to adjust the signal processing of the signal processor so as to minimize the at least one AM/PM-distortion. The generation of the at least one AM/PM-distortion is based on a known relationship between a first function describing the at least one AM/AM-distortion as a relationship between $A_{in}$ to $A_{out}$, where $A_{in}$ is the amplitude of an input signal and where $A_{out}$ is an amplitude of an output signal, and a second function describing the at least one AM/PM-distortion as a relationship of $A_{in}$ and $\Delta\phi$, where $\Delta\phi$ is a phase difference between an input and an output signal, wherein the relationship between the first function and the second function depends on environmental conditions, and wherein the relationship is described by a set of coefficients comprising three or more coefficients out of a group comprising r, τ, t, k and/or q, and wherein the transformation unit is configured to elect a set of coefficients out of a group, comprising a plurality of sets of coefficients, dependent on the current environmental conditions, where $$r = \frac{d\gamma(A_{in})}{dA_{in}}\bigg|_{A_{in}=0}, \quad (1)$$

where $Y(A_{in})$ is the second function, where $$\tau = \frac{d\gamma(A_{in})}{dA_{in}}\bigg|_{A_{in}\to\infty}, \quad (2)$$

where $$t + k = \gamma(A_{in})|A_{in} = 0 \quad (3)$$

and where q is an additional fitting parameter, wherein the relationship between the first and the second functional is approximated by the following formula:

$$\gamma(A_{in}) = \frac{dg(A_{in})}{dA_{in}}((r-\tau)A_{in}+k) + \tau A_{in} + t + qA_{in}^2, \quad (4)$$

where $g(A_{in})$ is the first function that describes the AM/AM distortions as a relationship between $A_{in}$ to $A_{out}$.

A further implementation refers to a controller for controlling a signal processor. The controller comprises a transformation unit, a control unit and an AM/AM-distortion calculator. The transformation unit is configured to generate at least one AM/PM-distortion within a signal, output by using the signal processor according to a signal processing, based on detected or generated at least one AM/AM-distortion of the signal. The control unit is configured to adjust the signal processing of the signal processor so as to minimize the at least one AM/PM-distortion. The AM/AM-distortion calculator is configured to generate the at least one AM/AM-distortion based on current environmental conditions, or an AM/AM-distortion detector coupled to the signal processor, and is configured to measure the AM/AM-distortion at the signal processor. The generation of the at least one AM/PM-distortion is based on a known relationship between a first function describing the at least one AM/AM-distortion as a relationship between $A_{in}$ to $A_{out}$, where $A_{in}$ is an amplitude of an input signal and where $A_{out}$ is an amplitude of an output signal, and a second function describing the at least one AM/PM-distortion as a relationship of $A_{in}$ and $\Delta\phi$, where $\Delta\phi$ is the phase difference between the input and the output signal, wherein the generation of the at least one AM/PM-distortion is based on a known relationship between the first derivative of the first function and the second function.

A method for controlling a signal processor comprises generating at least one AM/PM-distortion within a signal, output by using the signal processor according to a signal processing, based on detected or generated at least one AM/AM-distortion of the signal, and adjusting the signal processing of the signal processor so as to minimize the at least one AM/PM-distortion.

A further implementation provides a mobile communication device comprising a controller for controlling a signal processor. The controller comprises a transformation unit configured to generate at least one AM/PM-distortion within a signal, output by using the signal processor according to a signal processing, based on detected or generated at least one AM/AM-distortion of the signal. The controller further comprises a control unit configured to adjust the signal processing of the signal processor so as to minimize the at least one AM/PM-distortion.

BRIEF DESCRIPTION OF THE DRAWINGS

Implementations of the present disclosure will subsequently be discussed referring to the enclosed figures, wherein.

DETAILED DESCRIPTION

Figure 1A:
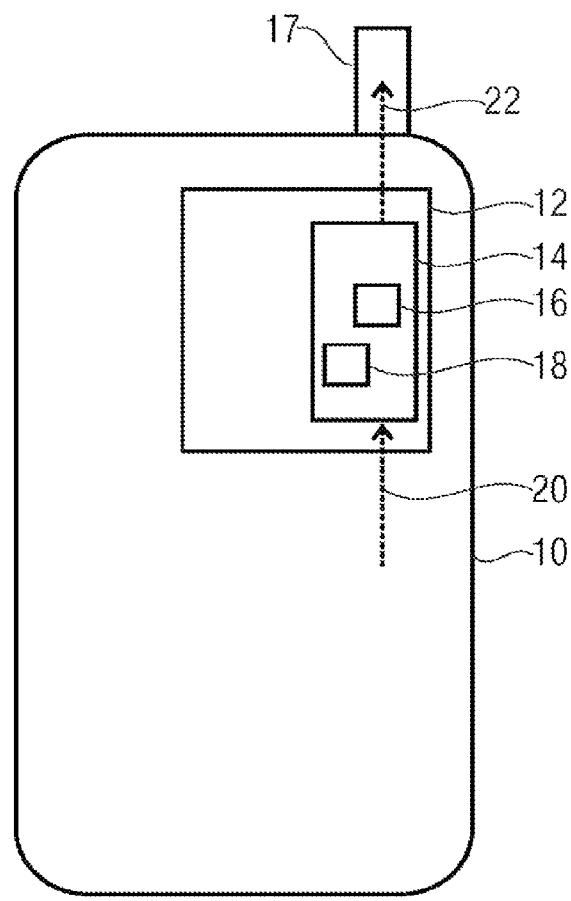
FIG. 1A shows a schematic block diagram of a mobile communication device comprising a transceiver having a controller for controlling the signal processor in order to minimize the AM/PM-distortions.

Different implementations of teachings disclosed herein will subsequently be discussed referring to FIGS. 1A to 6F below. Identical reference numbers are provided to objects having identical or similar functions so that objects referred to by identical reference numerals within different implementations are interchangeable and the description thereof is mutually applicable.

FIG. 1A shows a mobile communication device 10, e.g. a mobile phone or smart phone, comprising a transmitter unit 12. Here, the transmitter unit 12 comprises at least a signal processor 14 and a power amplifier 16 coupled to an antenna 17.

Below, the functionality of the transceiver 12 will be discussed with respect to outbound signals (cf. transmit (TX) signal 22), i.e. for the transmitter unit of the transceiver unit 12. The TX signal 22 is based on a baseband signal 20 provided by the baseband processor (not shown) to be transmitted. The baseband signal 20 is preprocessed by the signal processor 14, e.g. a predistortion unit and an ACLR calculator (adjacent channel leakage ratio calculator) and/or a (digital) envelope tracking unit, adaptive biasing unit, and amplified by the power amplifier 16. During this processing the baseband signal 20 is modulated onto a carrier and output as a radio frequency TX signal 22 via the antenna 17. As discussed above, the performing of the power amplifier 16 causes distortions like AM/AM-distortions and AM/PM-distortions.

The AM/AM-distortion and AM/PM-distortions can be minimized using a controller 18 or an adaptive (software) algorithm executed by the controller 18. The controller 18 controls the signal processor 14 and thus is coupled to same. Furthermore, the controller 18 may be coupled to the power amplifier 16 in order to analyze the AM/AM-distortions and/or the AM/PM-distortions.

Below, a plurality of methods for analyzing the AM/AM-distortions and the AM/PM-distortions will be discussed together with their drawbacks:

For example, the amplitude and/or the phase of the distorted signal 22 are measured at the power amplifier output 16 and compared to the amplitude and/or phase of the input signal 20. Because both, amplitude and phase are being measured at the output of the PA 16, the circuit complexity is high. Moreover, a phase measurement at the output of the PA 16 is difficult and imprecise due to the phase unwrapping problem and time delays in the system. According to a second example, the AM/AM- and AM/PM-distortions of the PA 16 are measured using an experimental setup in the lab. Based on these measurements the curves of the AM/AM- and AM/PM-distortions are equidistantly sampled. Subsequently the sampled points are stored in a lookup table. This approach suffers mainly on two disadvantages: on the one hand, large lookup tables are needed because a large number of sample points (e.g. 128 samples per curve) are needed to approximate accurately the AM/AM- and AM/PM-distortion curves. If the PA conditions, n, are considered, the number of lookup table entries grows linearly with n (e.g. 128 samples n). On the other hand, the description of the distortions using lookup tables is not a closed-form mathematical expression. Therefore, the resolution of the approximated AM/AM and AM/PM curves is limited by the quantization of the curves. According to a third example, the AM/AM- and AM/PM-distortions of the PA 16 are measured using an experimental setup in the lab. Based on these measurements, curves of the AM/AM- and AM/PM-distortions are fitted to closed-form mathematical expressions. For the AM/AM-distortions adequate mathematical expressions are known in literature. However, closed-form mathematical expressions to model the AM/PM-distortions are highly complex (e.g. polynomial degree of 9). This is due to the curvature of the AM/PM-distortions described in the following: the AM/PM curve has a constant gradient, when the PA 16 is operated at its linear region. When the PA saturates, the gradient of the AM/PM curve changes rapidly. At the region where the PA 16 is deeply saturated, the AM/PM curve again features constant gradient. According to a fourth example, it is assumed that the nonlinearity is dominated by the AM/AM-distortions and hence the AM/PM-distortions are neglected. Therefore, the circuit and software complexity is low. However, this assumption is not true for each application. For example, in case of using CMOS technologies for the power amplifier 16 the AM/PM-distortions play a significant role.

Therefore, there is the need for an improved approach for determining the distortions, especially the AM/PM-distortions. The improved approach is based on the principle that AM/PM-distortions may be generated based on known (calculated or measured) AM/AM-distortions. This relationship between the AM/AM- and AM/PM-distortion characteristics is stored within a model, wherein the characteristics may be provided by measurements. Below, the controller using the model for generating AM/PM-distortions based on detected AM/AM-distortions will be discussed in more detail with respect to FIG. 1B.

Figure 1B:
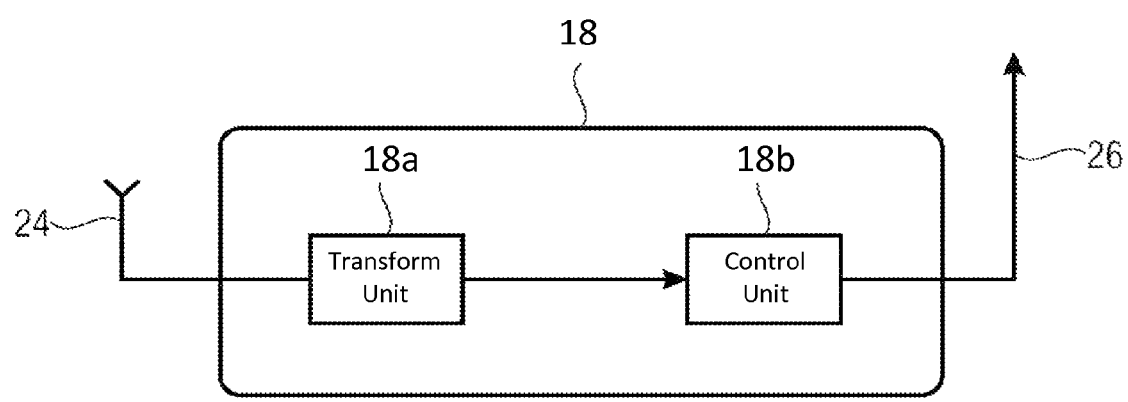
FIG. 1B shows a schematic block diagram of a controller for controlling a signal processor according to a basic implementation.

FIG. 1b shows the controller 18 comprising a transformation unit 18a and a control unit 18b. The transformation unit 18a performs a simulation of AM/PM-distortions 24 within signal 22 (cf. 1A). The simulation is based on the information on detected AM/AM-distortions 24 of the signal 22. Therefore, the transformer 18a has an input for receiving the information about the AM/AM-distortions 24. The information 24 may be based on a direct measurement of the AM/AM-distortions, as explained above, or may be based on a calculation of these AM/AM-distortions. The calculation of the AM/AM-distortion may take information on a current amplification, performed by the amplifier 16 into account, wherein the information is provided by the baseband processor (not shown), and/or may use an information on current environmental conditions (e.g. temperature or load impedance) as input values. Furthermore, the transformation unit 18a has an output for outputting an information on the generated AM/PM-distortion to the control unit 18b such that the control unit 18b is enabled to perform a controlling or an adjusting of the signal processor 14 (cf. FIG. 1A). Thus, the control unit 18b outputs a control signal 26 to the signal processor 14 dependent on the detected AM/PM-distortion, wherein the control signal 26 is selected such that the distortion behavior, especially the distortion behavior regarding AM/PM-distortions is compensated; i.e. that AM/PM-distortions are minimized due to the controller 18. Hereby, the controller 18 reduces the computational effort, the complexity of the mathematical models and the size of the above discussed lookup tables. Additionally, the problem of AM/PM-measurements in connection with phase unwrapping and time delay is circumnavigated. To summarize, the overall hardware complexity is considerably reduced by implementing the described controller 18.

Figure 2A:
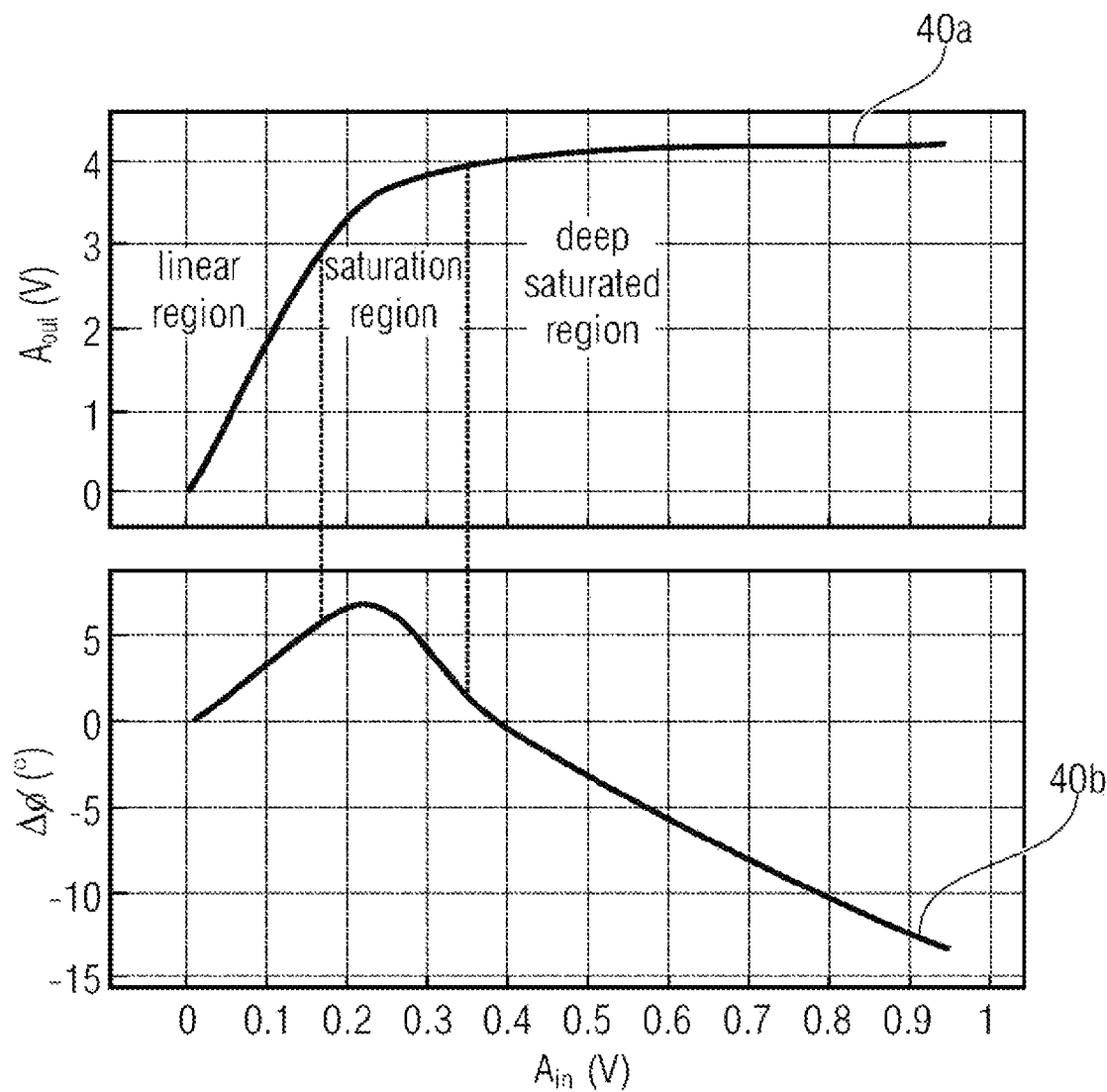
FIG. 2A shows a schematic diagram of AM/AM-distortions and a schematic diagram of AM/PM-distortions for illustrating the relationship between these two kinds of distortions.

The simulation of the AM/PM-distortion based on the AM/AM-distortion, performed by the transformation unit 18a of the controller 18 is based on a physical relationship between the two types of distortions. This physical relationship is shown by FIG. 2A. FIG. 2A shows a first diagram, in which the output amplitude $A_{out}$ is plotted over the input amplitude $A_{in}$, having a curve 40a for illustrating the AM/AM-distortions. As shown by the first diagram the AM/AM-distortion curve 40a has three different regions, a first linear region, a second saturation region and a third deep saturation region. The second diagram of the AM/PM-curve 40b shows the phase difference $\Delta\phi$ plotted over the input amplitude $A_{in}$.

It is observed that the curve of the AM/PM-distortion-curve 40b features a constant gradient when the power amplifier is operated at its linear region. When the power amplifier starts to saturate (cf. saturation region), the AM/PM-curve 40b starts to change its gradient rapidly. At the region when the power amplifier is operated deeply saturated (cf. deep saturation region), the AM/PM-curve 40b again features a constant gradient. The AM/AM-curve 40a also exhibits a constant gradient when the power amplifier is operated linearly. If the power amplifier is deeply saturated, the gradient of the AM/AM-curve 40a is almost zero, while when the PA starts to saturate, the gradient changes rapidly. Summarizing, the slopes of both diagrams 40a and 40b pose almost constant gradients, when the PA is operated in its linear region or when it is completely saturated. The gradients of both slopes 40a and 40b change rapidly when the PA starts to saturate. The assignments between the respective regions are illustrated by broken lines. From the mathematical point of view the transition from the linear region to the saturation region as well as the transition from the saturation region to the deep saturation region is described by the first derivative of a function describing the AM/AM-distortion curve. This consequently means that the AM/PM-distortions are detectable based on detected or known or calculated AM/AM-distortion.

Figure 2B:
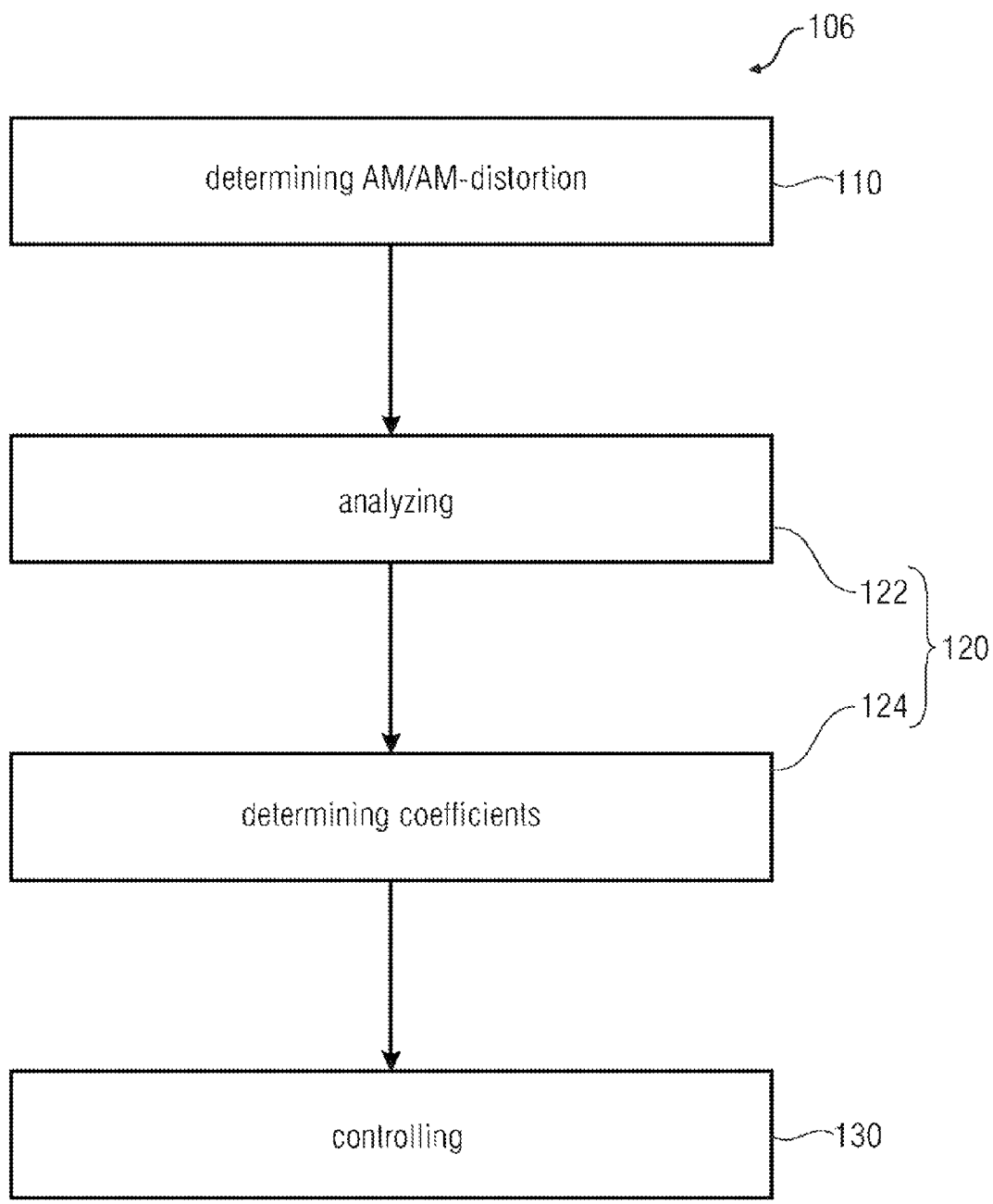
FIG. 2B shows a schematic flow chart for illustrating the method for controlling the signal processor in order to avoid the AM/PM-distortions.

The entire method 100 for generating the AM/PM-distortions will be discussed below: FIG. 2B shows a flowchart comprising the acts of calculating or measuring the AM/AM-distortions at 110, generating the AM/PM-distortions at 120 and controlling the signal processor at 130 based on the result of the simulation. The act 120 of generating the AM/PM-distortions may comprise two sub-acts 122 and 124 in one embodiment.

The act 110 of determining the AM/AM-distortions may be based on a measurement of these distortions, e.g. at the output of the power amplifier, or may be based on a simulation or calculation of the distortions, wherein the simulation and calculation, respectively, is based on known or measured environmental conditions and/or a known mode of operations (e.g. amplification gain, amplitude of the TX signal or further information available from the baseband processor). The result of act 110 is a curve of the AM/AM-distortions like the curve 40a (cf. FIG. 2A).

The next act 122 relates to an analyzing of the detected curve of the AM/AM-distortions. The sub-act 122 of the act generating the AM/PM-distortions at 120 comprises performing the transformation of the detected AM/AM-distortions in order to obtain an information about the slope of the AM/AM-distortions. This information is used to effectively construct the AM/PM-distortion model. This AM/PM-distortion model may be described in one embodiment by the following formula:

$$\gamma(A_{in}) = \frac{dg(A_{in})}{dA_{in}}((r-\tau)A_{in} + k) + \tau A_{in} + t, \qquad (5)$$

where $g(A_{in})$ is the first function that describes the AM/AM distortions as a relationship between $A_{in}$ to $A_{out}$. It should be noted that the formula will be described in detail below. As can be seen by the formula, same comprises a plurality of coefficients (cf. τ, r, t, k, q) depending on environmental conditions. Therefore, these coefficients of the formula or of the AM/PM-distortion model are determined during the next act 124. Therefore, the sub-act 124 of the act 120 comprises determining the coefficients τ, r, t, k and/or q (cf. Formula infra for the optional parameter q) such that the error between the closed-form mathematical expression and the measurements are minimized in a least square sense. Several approaches to determine the model coefficients are conceivable: according to a first approach, for each environmental condition of the power amplifier, the coefficients τ, r, t, k and q are stored in a lookup table. Therefore, only the current environmental conditions are to be determined on the chip or to be received externally. This approach goes ahead with an experimental measurement setup in a lab in order to determine and to store the model coefficients for each environmental condition possibility. According to a second approach, the coefficients τ, r, t, k and q are derived from closed-form mathematical expressions that relate the environmental conditions directly to the coefficients. It is believed that the best mode for modeling accurately the AM/PM-distortion model is to determine the five coefficients. However, depending on the characteristics of the power amplifier, one or several coefficients of the AM/PM-model may be set to zero, to further reduce the model complexity. In particular, the optional coefficient q is set to zero for most applications. Only if high accuracy is desired at the region where the power amplifier is deeply saturated, the coefficient q is not set to zero. Because this is usually not the case, the model mostly comprises four coefficients. Therefore, the size of the lookup table may be reduced considerably in one embodiment.

The last act 130 relates to a controlling of a signal processor. The controlling is done such that the AM/PM-distortions are minimized. Consequently, the controller operates based on the determined AM/PM-distortions available as closed-form mathematical expression (cf. act 120).

Below, the mathematical background which forms the basis for the above discussed AM/PM-model and the above formula according to one embodiment, respectively, will be discussed. The model is constructed by applying a transformation to the related AM/AM-distortion curve to obtain information about the latter slope. Using the information of the slope of the AM/AM-distortion curve reduces the complexity of the AM/PM-distortion model to only five or even four additional coefficients (cf. method act 120). The below discussion is made based on the so-called Rapp AM/AM-model describing the AM/AM distortions. According to the Rapp AM/AM-model the distortions are described as follows:

$$g(A_{in}) = \frac{vA_{in}}{\left(1+\left(\frac{vA_{in}}{A_0}\right)^{2p}\right)^{\frac{1}{2p}}}, \quad (6)$$

where $A_{in}$ is the amplitude of the input signal, v is the small signal gain, $A_0$ is the limiting output amplitude and p is the knee factor. The coefficients $A_0$, v, and p of the Rapp AM/AM-model may be determined using an experimental measurement setup in the lab or directly on the chip. The transformation of the AM/AM-distortion model is done as described with respect to the method act 122. The transformation is performed by taking the derivative of the Rapp AM/AM model:

$$\frac{dg}{dA_{in}} = \frac{v}{\left(1+\left(\frac{vA_{in}}{A_0}\right)^{2p}\right)^{\frac{1}{2p}}}. \quad (7)$$

For computational simplicity, the derivative of the Rapp AM/AM model is normalized to the small signal gain, as shown below:

$$\left.\frac{dg}{dA_{in}}\right|_{A_{in}=0} = v \quad (8)$$

$$g'_n(A_{in}) = \frac{\frac{dg}{dA_{in}}}{\left.\frac{dg}{dA_{in}}\right|_{A_{in}=0}} = \frac{v}{\left(1+\left(\frac{vA_{in}}{A_0}\right)^{2p}\right)^{\frac{1}{2p}}}. \quad (9)$$

As mentioned, the AM/AM-distortions may be calculated by using the above formulas. The result of this calculation is shown by FIG. 3A.

Figure 3A:
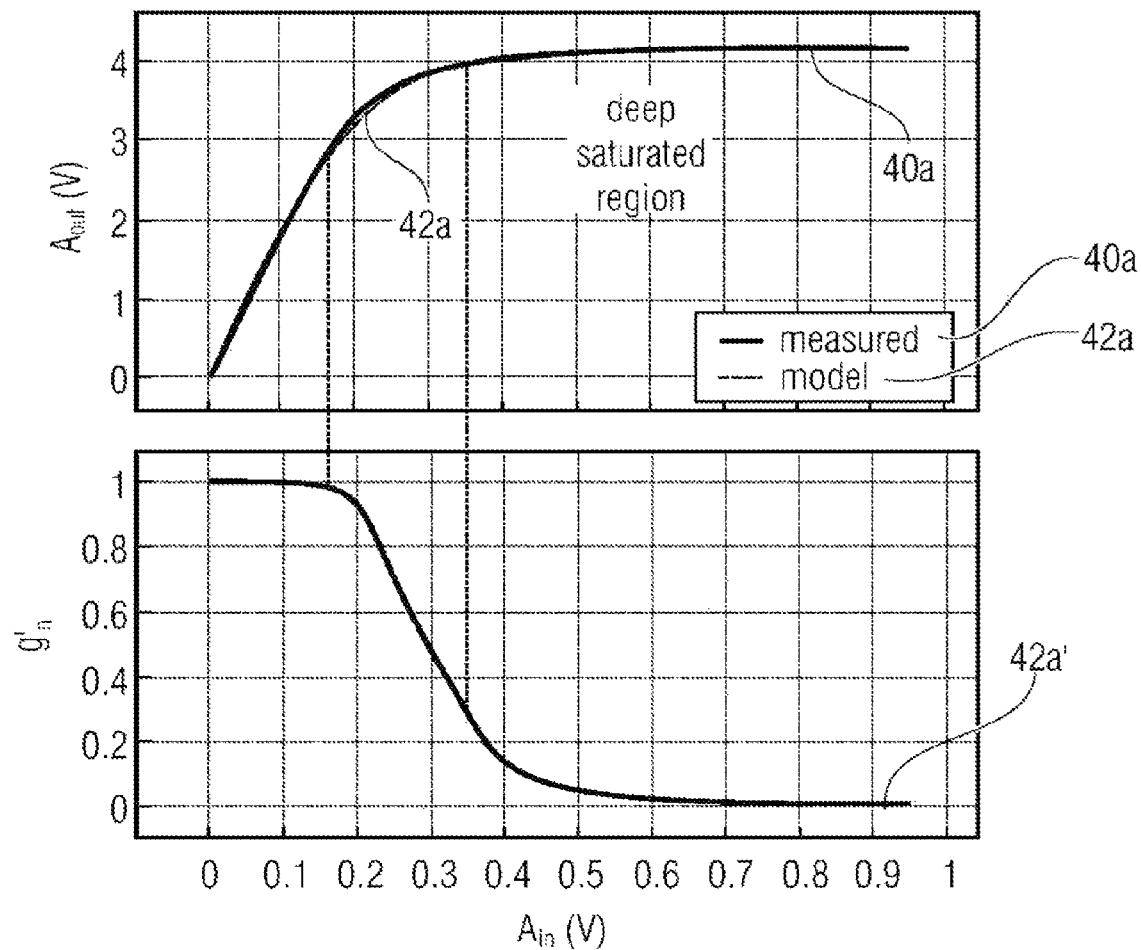
FIGS. 3A-3E show schematic diagrams for illustrating the mathematical background used for avoiding the AM/PM-distortions.

FIG. 3A shows two diagrams, wherein the first diagram shows the output amplitude $A_{out}$ plotted over the input amplitude $A_{in}$ and wherein the second diagram shows the derivative input amplitude $g'_n(A_{in})$ plotted over the input amplitude $A_{in}$. The first diagram illustrates a comparison between the AM/AM-distortion curve 40a (measured, cf. FIG. 2A) and a further AM/AM-distortion curve 42a (calculated by using the Rapp model). The second diagram illustrates the normalized derivative 42a'. It is observed that the derivative is substantially constant at the linear and deeply saturated regions of the power amplifier, wherein the derivative changes rapidly when the power amplifier starts to saturate. With respect to the deep saturated region, the behavior described before is useful to derivate effectively the AM/PM-distortion model. This AM/PM-distortion model is illustrated by FIG. 3B.

Figure 3B:
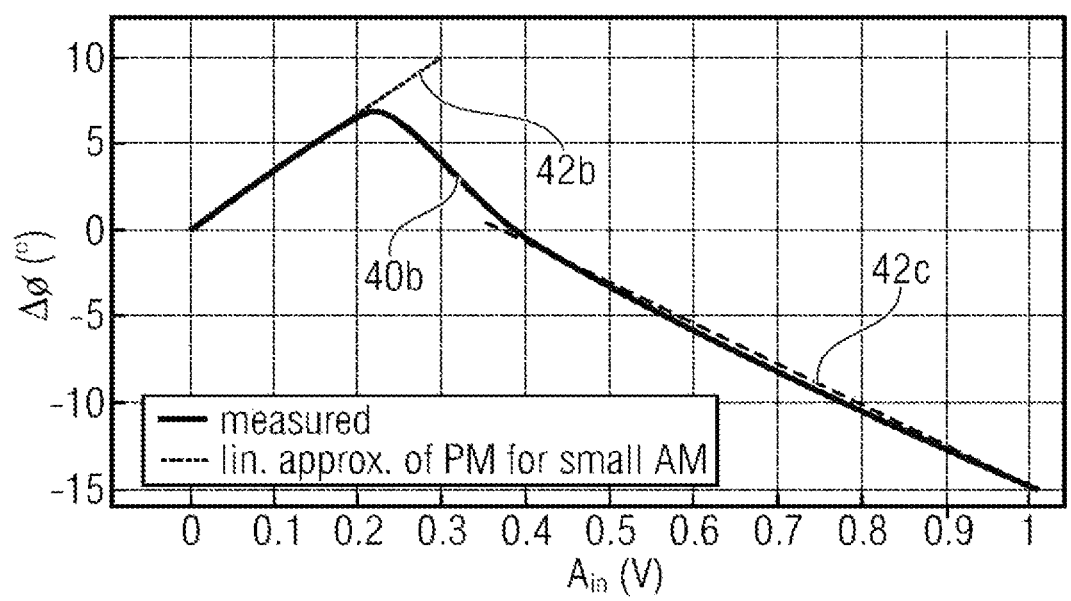

FIG. 3B shows a diagram of the AM/PM-distortion model comprising the curve 40b (cf. FIG. 2A), wherein the further curve 42b illustrating the linear approximation of the phase distortion at the linear operating region of the PA and wherein the further curve 42c illustrating the linear approximation of the phase distortion at the deep saturated operating region of the PA is shown. As can be seen by the diagram of FIG. 3B, the linear approximation of the AM/PM-distortion 42b is approximated just for the small AM/AM-distortions, i.e. for the region where the power amplifier is operated linearly. This region may be mathematically described as follows:

$$\gamma_{lin}=(r-\tau)\cdot A_{in}+k, \quad (10)$$

where the coefficients r, k and τ are derived by regression or calculated directly. As can be seen by the diagram of FIG. 3B, the linear approximation of the AM/PM-distortion 42c is approximated just for the large AM/AM-distortions, i.e. for the region where the power amplifier is operated in deep saturation. This region may be mathematically described as follows:

$$\gamma_{sat}=\tau \cdot A_{in}+t, \quad (11)$$

where the coefficients τ and t are derived by regression or calculated directly.

Figure 3C:
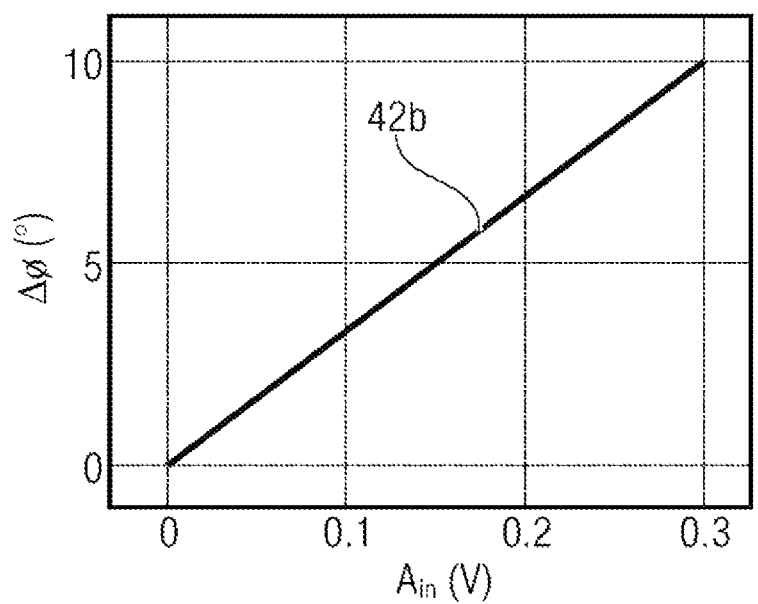
Figure 3D:
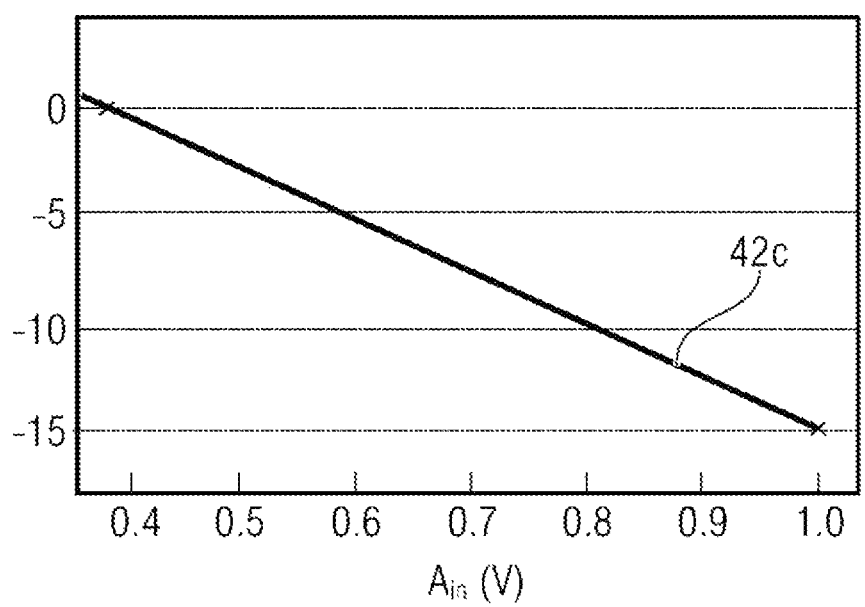

FIG. 3C shows a diagram illustrating the linear approximation of a phase distortion 42b at the linear operating region of the power amplifier. FIG. 3D shows a diagram illustrating the linear approximation of a phase distortion 42c at the deep saturated operating region of the power amplifier. Considering the last paragraphs, the gradient of the AM/PM-curve 42b is constant when the power amplifier is operated linearly. When the power amplifier saturates, the gradient changes rapidly until the power amplifier is saturated deeply. At this region, the AM/PM curve 42c decreases linearly (constant gradient). Reconsidering equation (9) for $g'_n(A_{in})$ and the corresponding figure (cf. FIG. 3A), it is observed that the derivative of the AM/AM-distortion curve 40a or 42a, describes the location of the operating regions and the transitions between the operating regions of the PA. To make use of this information, the derivative of the AM/AM-distortion curve 40a or 42a is multiplied by the linear approximation of the AM/PM-distortion curve 42b and the linear approximation of the AM/PM-distortion curve 42c is added to this product. This leads to the above already used formula (5):

$$\gamma(A_{in}) = \gamma(A_{in}) = \frac{dg(A_{in})}{dA_{in}}((r-\tau)A_{in}+k)+\tau A_{in}+t = \qquad (5)$$

$$\left(\frac{1}{\left(1+\left(\frac{vA_{in}}{A_0}\right)^{2p}\right)^{\frac{1}{2p}+1}}\right)\cdot((r-\tau)\cdot A_{in}+k)+\tau A_{in}+t$$

Figure 3E:
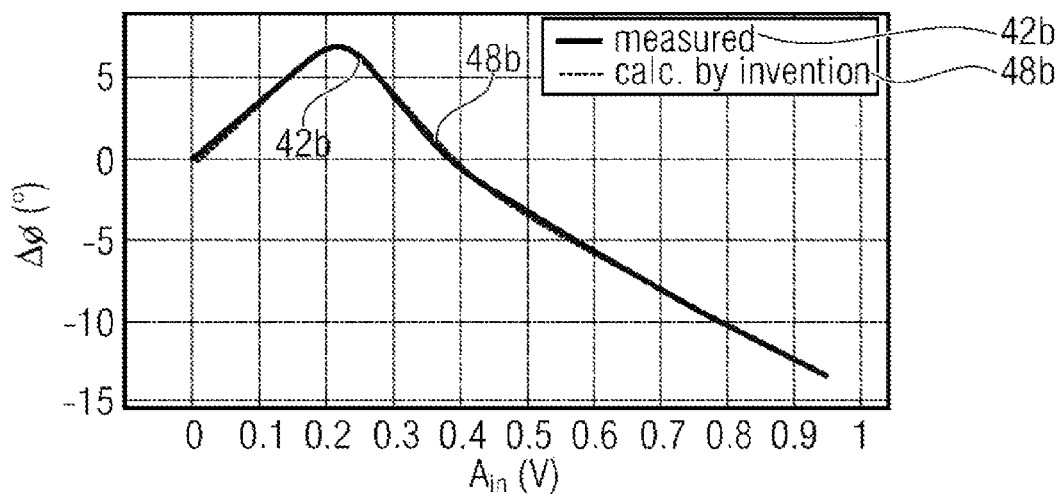

The result of this step is visualized in the FIG. 3E.

FIG. 3E shows a diagram in which the phase difference $\Delta\phi$ is plotted over the input amplitude $A_{in}$. The diagram of FIG. 3E comprises a first curve 40b for the measured AM/PM-distortions (cf. FIG. 2A and FIG. 3B) and a further curve 48b for the AM/PM-distortions calculated by the formula (5).

For higher accuracy of the AM/PM-distortion-model at the region, where the power amplifier is deeply saturated, equation (5) becomes $$\gamma(A_{in}) = \frac{dg(A_{in})}{dA_{in}}((r-\tau)A_{in}+k)+\tau A_{in}+t+qA_{in}^2, \qquad (12)$$

where q is an additional fitting parameter. With the help of the additional parameter q, the higher accuracy is achieved. Considering equations (6) and (5), another benefit is observed for the special case of using the Rapp AM/AM model: the denominator of both equations is equal, except that the denominator in equation (6) is multiplied by the term in brackets in equation (5). Therefore, computationally efficient implementations are possible, by calculating the term in brackets and the denominator of one of the equations once and reusing the results stored for the computation of other equations. Even if not shown in the discussion above, it can be observed from the mathematical formulations that an AM/PM distortion curve with opposite behavior, i.e. that decreases at the linear region and increases at the deeply saturated region of the power amplifier, can be described by the above formulas. Even though in the above discussion the AM/AM-distortions are calculated by using the Rapp model, it should be noted that the way of transforming the AM/AM-distortions to AM/PM distortions is not limited to AM/AM-distortions calculated by the Rapp model. Therefore, the above discussed transformation according to further implementations may also be applied to AM/AM-distortion curves determined by further models or determined by a measurement.

Figure 4A:
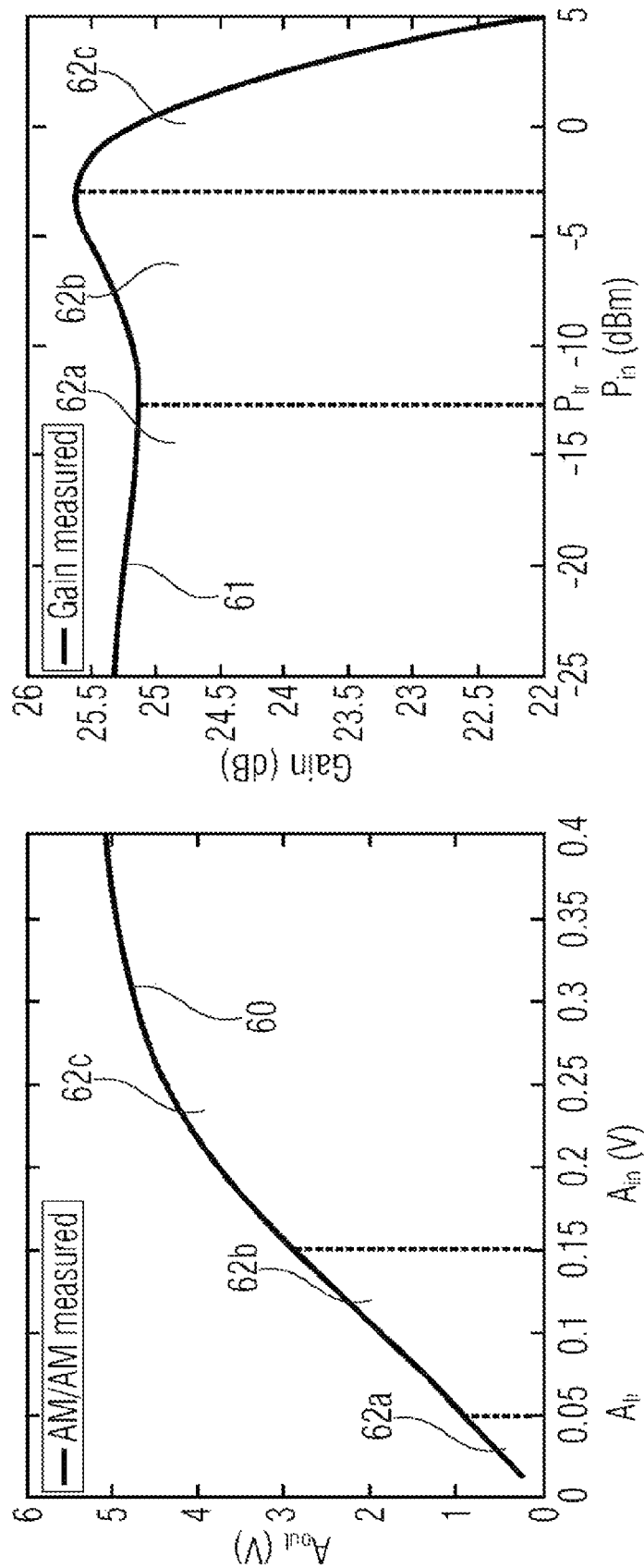
FIGS. 4A-4D show schematic diagrams for illustrating an alternative mathematical method enabling the avoidance of AM/PM-distortions.

With respect to FIGS. 4A to 4D, a further mathematical method for determining and avoiding AM/PM-distortions will be discussed according to another embodiment. The discussion is made based on an advanced AM/AM model that also considers the effect of gain expansion present when the PA is operated in a dedicated mode. FIG. 4A shows a comparison of AM/AM-distortions 60 (left) and gain characteristic 61 (right) of a PA that may exhibit gain expansion. The input-output characteristic of the PA first follows a linear relationship (constant gain) at small input amplitudes (see first region marked by 62a). At a second region marked by 62b, it experiences a faster rate of change (gain expansion. At a third region marked by 62c, it follows a slower rate ending in saturation (decreasing gain).

The characteristic illustrated in FIG. 4A is a typical example of a PA exhibiting both weak and strong nonlinearities. The behavior can be mathematically described as follows:

$$[A_{out}(A_{in}) = \begin{cases} vA_{in}, & A_{in} < A_{tr}, \\ \dfrac{v(A_{in}-A_{tr})e^{w(A_{in}-A_{tr})}}{\left(1+\left(\frac{v(A_{in}-A_{tr})e^{w(A_{in}-A_{tr})}}{A_0-vA_{tr}}\right)^{2p}\right)^{1/2p}}+vA_{tr}, & A_{in} \geq A_{tr}, \end{cases} \qquad (13)$$

where $$[P_{in} = 10\mathrm{dB}\,\log\left(\frac{A_{in}^2}{50\cdot 1e^{-3}}\right), \qquad (14)$$

and $$\mathrm{Gain} = 20\mathrm{dB}\,\log\left(\frac{A_{out}}{A_{in}}\right). \qquad (15)$$

$A_{in}$ is the amplitude of the input signal, v is the small signal gain, $A_0$ is the limiting output amplitude, w is the gain expansion factor, p is the knee factor and $A_{tr}$ is the transition amplitude describing the transition between the linear and the gain expansion region. The coefficients $A_0$, v, w, $A_{tr}$, and p of the AM/AM model can be determined using an experimental measurement setup in the lab or directly on chip. The result of this calculation is shown by FIG. 4B.

Figure 4B:
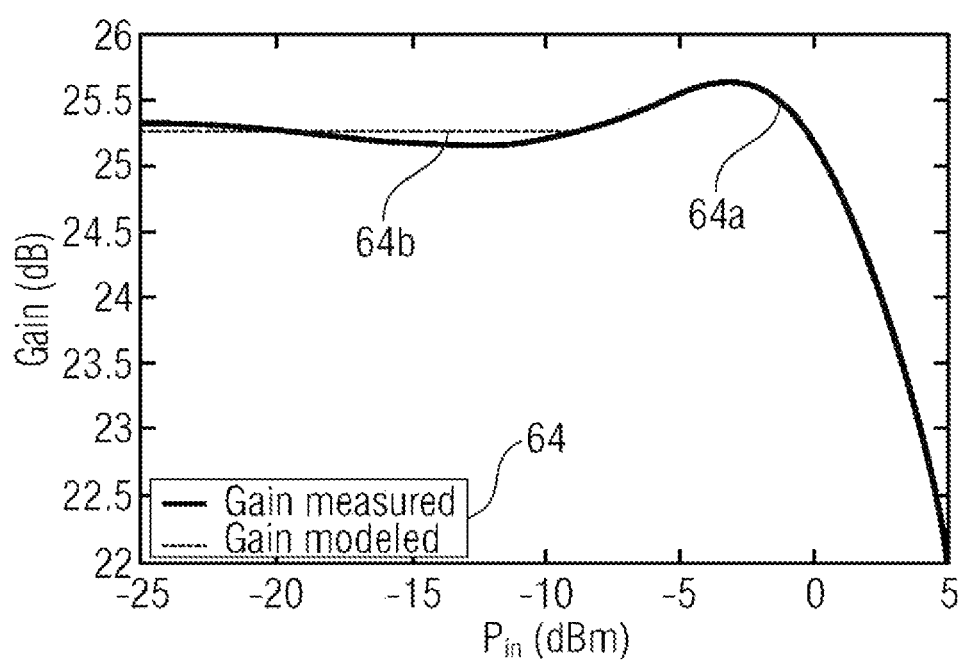

FIG. 4B shows a gain characteristic 64 of a PA exhibiting gain expansion. The solid line marked by 64a shows the measured gain; the dashed line marked by 64b shows the modeled gain.

The transformation of the AM/AM-distortion model is done as described with respect to the method act 122. The transformation is performed by taking the derivative of the advance AM/AM model:

$$\frac{dg}{dA_{in}} = \begin{cases} v, & A_{in} < A_{tr}, \\ \dfrac{v(1+w(A_{in}-A_{tr}))e^{w(A_{in}-A_{tr})}}{\left(1+\left(\frac{v(A_{in}-A_{tr})e^{w(A_{in}-A_{tr})}}{A_0-vA_{tr}}\right)^{2p}\right)^{\frac{1}{2p}+1}}, & A_{in} \geq A_{tr}. \end{cases} \qquad (16)$$

For computational simplicity, the derivative of the advance AM/AM model is normalized to the small signal gain, as shown below:

$$\left.\frac{dg}{dA_{in}}\right|_{A_{in}=0} = v, \qquad (17)$$

-continued $$g'_n(A_{in}) = \tag{18}$$

$$\frac{\frac{dg}{dA_{in}}}{\frac{dg}{dA_{in}}\bigg|_{A_{in}=0}} = \begin{cases} 1, & A_{in} < A_{tr}, \\ \dfrac{(1+w(A_{in}-A_{tr}))e^{w(A_{in}-A_{tr})}}{\left(1+\left(\dfrac{v(A_{in}-A_{tr})e^{w(A_{in}-A_{tr})}}{A_0-vA_{tr}}\right)^{2p}\right)^{\frac{1}{2p}+1}}, & A_{in} \geq A_{tr}. \end{cases}$$

As mentioned, the AM/AM-distortions may be calculated by using the above formulas. The result of this calculation is shown by FIG. 4C.

Figure 4C:
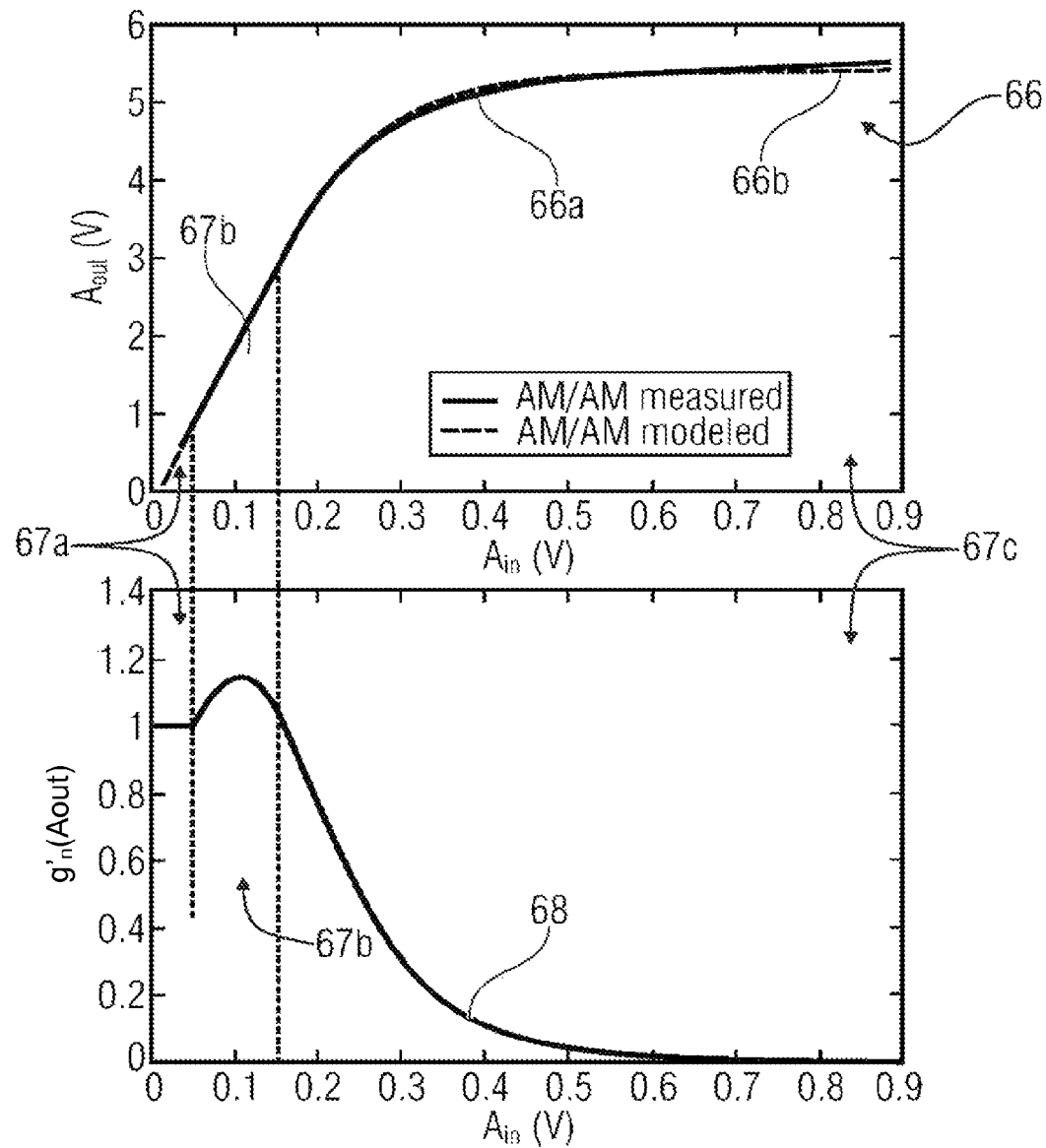

FIG. 4C shows two diagrams, wherein the first diagram 66 shows the output amplitude $A_{out}$ plotted over the input amplitude $A_{in}$ and wherein the second diagram shows the derivative of the modeled output amplitude $g'_n(A_{in})$ plotted over the input amplitude $A_{in}$. The first diagram illustrates a comparison between the AM/AM-distortion curve 66a (solid line) and a further AM/AM-distortion curve 66b (dashed line) calculated by using the advanced AM/AM model, cf. Eq. (16). The second diagram 68 illustrates the normalized derivative. It is observed that the derivative is constant at the linear region 67a and deeply saturated region 67c of the power amplifier, wherein it changes rapidly when the power amplifier starts to saturate. With respect to the deep saturated region 67b, the behavior described before is useful to derive effectively the AM/PM-distortion model. This AM/PM-distortion model is illustrated by FIG. 4D.

Figure 4D:
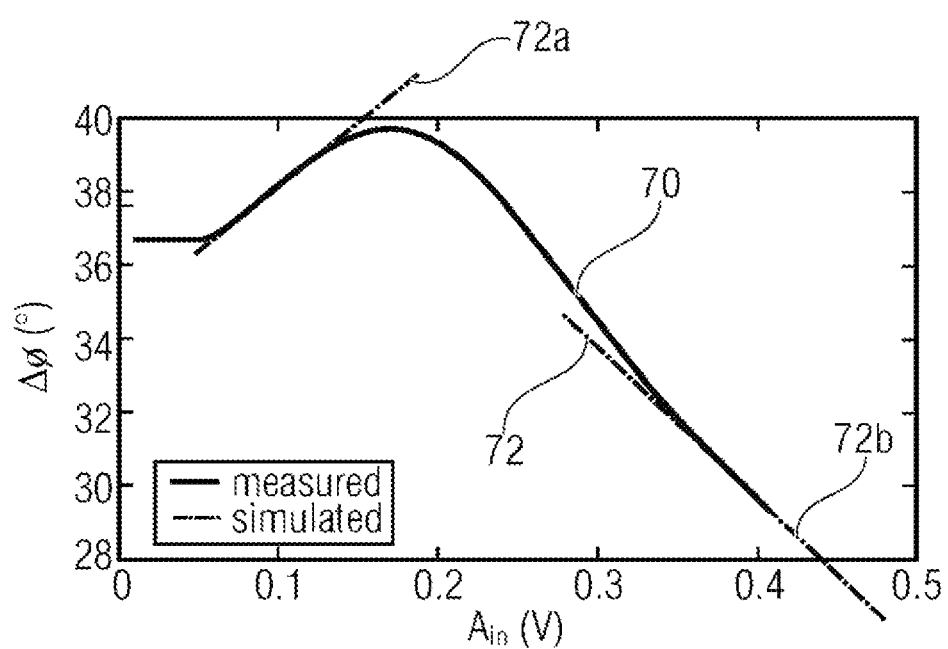

FIG. 4D shows a diagram of the AM/PM-distortion model for illustrating the phase characteristic of the PA. The solid line 70 illustrates the measured phase difference, wherein the dashed lines 72 show the modeled phase difference. At the linear region, the phase difference is approximated by a constant (FIG. 4C, region 67a), as described by the derivative of the AM/AM model (cf. Eq. (18)). This region may be mathematically described as follows:

$$\gamma_{const} = k+t, \tag{19}$$

where the coefficients k and t are derived by regression or calculated directly. At the beginning of the region, where the gain expansion occurs (FIG. 4C, beginning of region 67b), and at the deep saturated region (FIG. 4C, end of region 67c), the phase is approximated linearly.

As can be seen by the diagram of FIG. 4D, the linear approximation of the AM/PM-distortion at region 67b is approximated just for the small AM/AM-distortions (line 72a). This region may be mathematically described as follows:

$$\gamma_{lin} = (r-\tau) \cdot A_{in} + k, \tag{20}$$

where the coefficients r, k and τ are derived by regression or calculated directly. As can be seen by line 72b in the diagram of FIG. 4D, the linear approximation of the AM/PM-distortion is approximated just for the large AM/AM-distortions, i.e. for the region where the power amplifier is operated in deep saturation. This region may be mathematically described as follows:

$$\gamma_{sat} = \tau \cdot A_{in} + t, \tag{21}$$

where the coefficients τ and t are derived by regression or calculated directly.

Considering the last paragraphs, the gradient of the AM/PM-curve is constant when the power amplifier is operated linearly. When the power amplifier saturates, the gradient changes rapidly until the power amplifier is saturated deeply. At this region, the AM/PM curve decreases linearly (constant gradient). Reconsidering equation (16) for $g'_n(A_{in})$ and the corresponding figure (cf. FIG. 4C), it is observed that the derivative of the AM/AM-distortion curve, describes the location of the operating regions and the transitions between the operating regions of the PA. To make use of this information, for $A_{in}<A_{tr}$, the derivative of the AM/AM-distortion curve is multiplied by equation (19) and for $A_{in} \geq A_{tr}$, the derivative of the AM/AM-distortion curve is multiplied by the linear approximation of the AM/PM-distortion curve 72a and the linear approximation of the AM/PM-distortion curve 72b is added to this product. This leads to the above already used formula (5):

$$\gamma(A_{in}) = \gamma(A_{in}) = \tag{22}$$

$$= \begin{cases} \dfrac{dg(A_{in})}{dA_{in}}\bigg|_{A_{in} \geq A_{tr}} (k+t), & A_{in} < A_{tr}, \\ \dfrac{dg(A_{in})}{dA_{in}}\bigg|_{A_{in} \geq A_{tr}} ((r-\tau)A_{in}+k) + \tau A_{in} + t, & A_{in} \geq A_{tr} \end{cases}$$

$$= \begin{cases} k+t, \\ \dfrac{(1+w(A_{in}-A_{tr}))e^{w(A_{in}-A_{tr})}}{\left(1+\left(\dfrac{v(A_{in}-A_{tr})e^{w(A_{in}-A_{tr})}}{A_0-vA_{tr}}\right)^{2p}\right)^{\frac{1}{2p}+1}} ((r-\tau)A_{in}+k) + \tau A_{in} + t, \end{cases}$$

The result of this step is visualized in the FIG. 4d. Considering equations (13) and (22), another benefit is observed for the special case of using the advanced AM/AM model: the denominator of both equations is equal, except that the denominator in equation (13) is multiplied by the term in brackets in equation (22). Therefore, computationally efficient implementations are possible, by calculating the term in brackets and the denominator of one of the equations once and reusing the results stored for the computation of other equations. Even if not shown in the discussion above, it can be observed from the mathematical formulations that an AM/PM discussion curve with opposite behavior, i.e. that decreases at the linear region and increases at the deeply saturated region of the power amplifier, can be described by the above formulas.

Below, an implementation using the above described transformation will be discussed.

Figure 5:
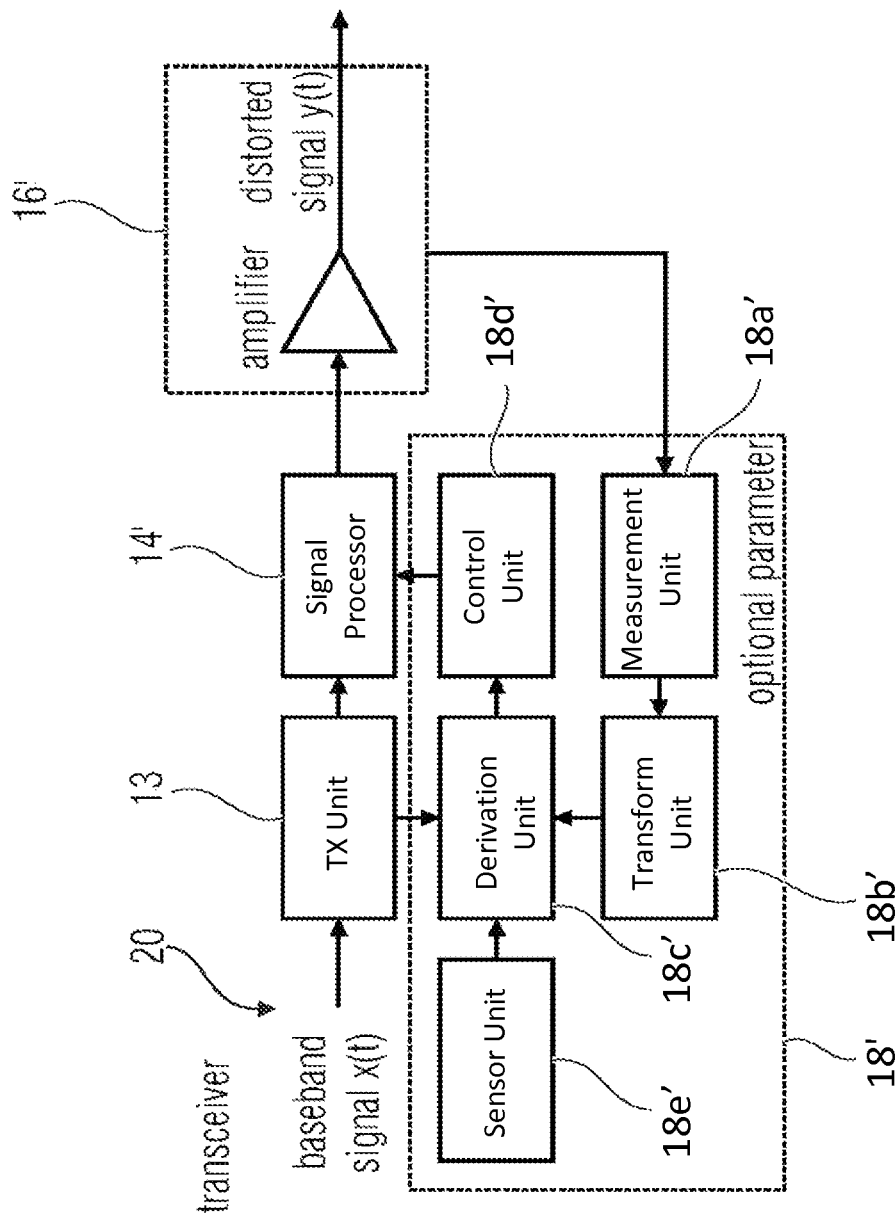
FIG. 5 shows a schematic block diagram of a controller for controlling the signal processor in order to minimize AM/PM-distortions according to an enhanced implementation.

FIG. 5 shows a transmission chain 11 of a transceiver for transmitting a baseband signal 20 comprising a transmitter unit 13, a signal processor 14' and an amplifier 16'. Furthermore, a controller 18' is arranged as feedback loop in parallel to the transmission chain 11. In this implementation the controller 18' comprises four basic units, namely a measurement unit 18a' for measuring the AM/AM-distortions, a transformation unit 18b' for performing the transformation of the AM/AM model to derive an AM/PM model, a unit 18c' for deriving optimal AM/PM parameters and a unit 18*d'* for controlling the signal processor 14' in order to adjust the AM/PM-characteristics. The unit 18*a'* is coupled to the output of the amplifier 16' and provides the input information for the transformation unit 18*b'* and thus for the unit 18*c'*. The unit 18*c'* is coupled to the transmitter unit 13 in order to receive information on the current operation mode (e.g. gain) of the transmitter and coupled to an optional sensor unit 18*e'* for detecting current environmental conditions. The control unit 18*d'* is coupled to the signal processor 14' and the transformation units 18*b'* and 18*c'*.

The unit 18*b'* in combination with the unit 18*c'* performs the transformation as described with respect to FIG. 3. In terms of the in FIG. 2B described method 100, this means that the two units 18*b'* and 18*c'* are configured to perform the method acts 122 and 124 (cf. 120). In these terms, the unit 18*a'* is configured to perform the method act 120, wherein the unit 18*d'* is configured to perform the method step 130.

Figure 6A:
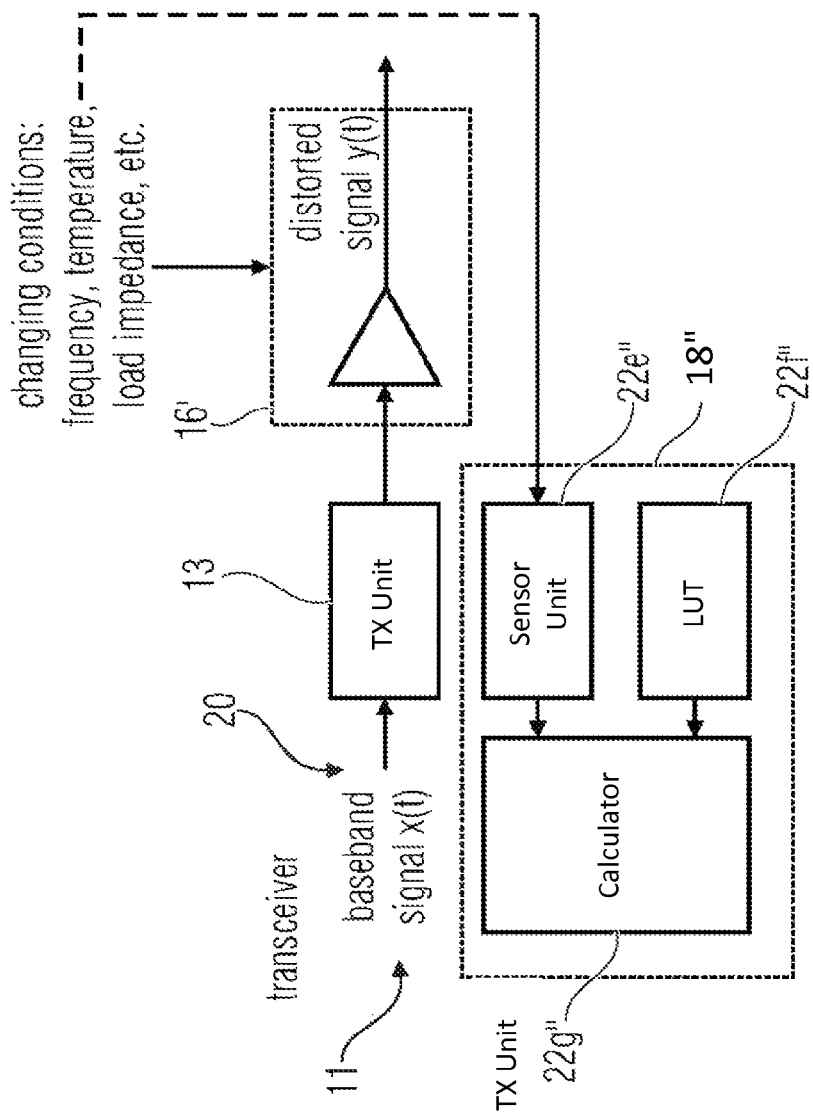
FIGS. 6A-6F show further schematic block diagrams of part views of controllers for controlling signal processors according to alternative implementations.
Figure 6B:
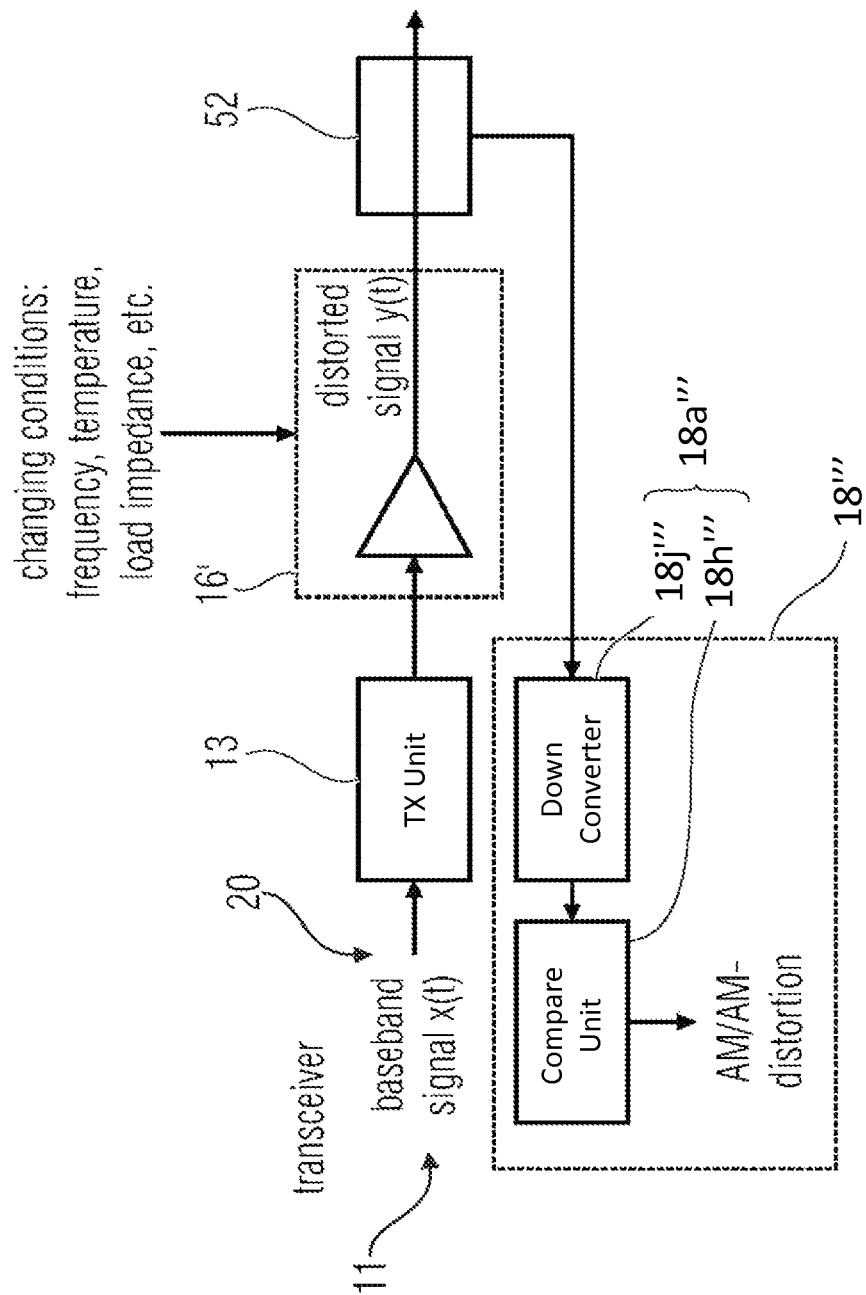

In the following, further alternative implementations will be discussed with respect to FIG. 6A to 6E, wherein FIGS. 6A and 6B illustrate two alternatives for the derivation of the AM/AM-distortion curve.

FIG. 6A shows the transmit chain 11, comprising the transmitter unit 13 for transmitting the baseband signal 20 and the amplifier 16', and a part view of the controller 18''. Here, in contrast to the implementation of FIG. 5, the AM/AM-distortions are calculated by the controller 18*a''* based on environmental conditions. As discussed above, the (AM/AM-) distortion of the power amplifier 16' depends on the environmental conditions, like frequency, temperature or load impedance. Therefore, the controller 18'' comprises the sensing unit 18*e''* for measuring the environmental conditions and a lookup table (LUT) 18*f''* having stored thereon a parameter set describing the AM/AM-distortions dependent on the respective environmental conditions. Furthermore, the controller 18' comprises a calculator 18*g''* for calculating the AM/AM-distortions based on the measured conditions and based on the stored parameter sets (cf. lookup table 18*f''*). It should be noted that the relationship between the respective environmental conditions and the resulting AM/AM-distortions may alternatively be stored as a function in the unit 18*f''*. From another point of view this means that the respective AM/AM-distortions are characterized under different conditions such that it is possible to derivate the respective AM/AM-distortion for determined conditions. This deviation is performed by the calculator 18*g''*. Although it is not shown, it is clear that the shown controller 18' may also comprise the transformation unit for performing the transformation of the calculated AM/AM-distortions to AM/PM-distortions, and the control unit for controlling the transmit chain 11 such that the AM/PM-distortions are avoided or reduced.

FIG. 6B shows a part view of an implementation of the controller 18'' with focus on the detection of the AM/AM-distortions. Here, the controller measures the AM/AM-distortions at the output of the amplifier 16' of the transmission channel 11 by using a further element 52. The further element 52 may, for example, be a coupler or divider or another active or passive component which is configured to generate an attenuated replica of the signal output by the power amplifier 16' without influencing the transmission of the transmission chain 11. Via this further element 52 the distort signal is analyzed in the controller 18'''. Therefore, the controller 18''' comprises an AM/AM-distortion measuring unit 18*a'''* The measuring unit 18*a'''* comprises a down conversion unit 18*r* and a unit 18*h'''* which is configured to perform a comparison between the baseband signal 20 and the down converter distorted signal output by the down conversion unit 18*j'''*. It should be noted that the down conversion unit 18*j'''* may also be configured to perform a direct measurement of the parameter indicating the AM/AM distortions. Some significant parameters may, for example, be the peak power, the RMS power or the phase. The comparison unit 18*h'''* outputs an information on the AM/AM-distortion curve which may have the shape of a function or may be described by function parameters or may be described by a plurality of measuring points. The result of the determination of the AM/AM-distortion curve may be output to the units of the controller 18' performing the subsequent method steps.

Figure 6C:
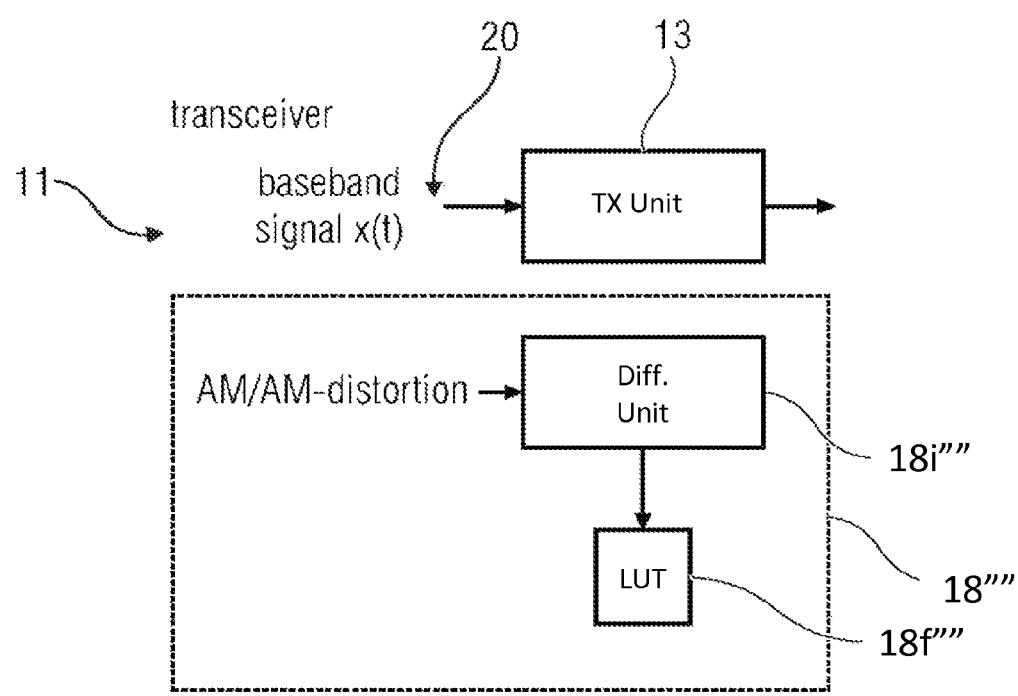

With respect to FIGS. 6C and 6D, different implementations of the controller, especially with focus on the transformation of the AM/AM-distortion into a storable AM/AM-transformation curve will be discussed. FIG. 6C shows the transceiver comprising the transmit chain 11 and a partial view of the controller 18''''. The controller 18'''' comprises a differentiator unit 18*i''''*, here a hardware implemented differentiator unit, which is configured to obtain the derivative of the AM/AM-curve and to store the AM/AM-curve in a lookup table 18*f''''* (cf. 18*f''* in FIG. 6A), for example as a function parameter.

Figure 6D:
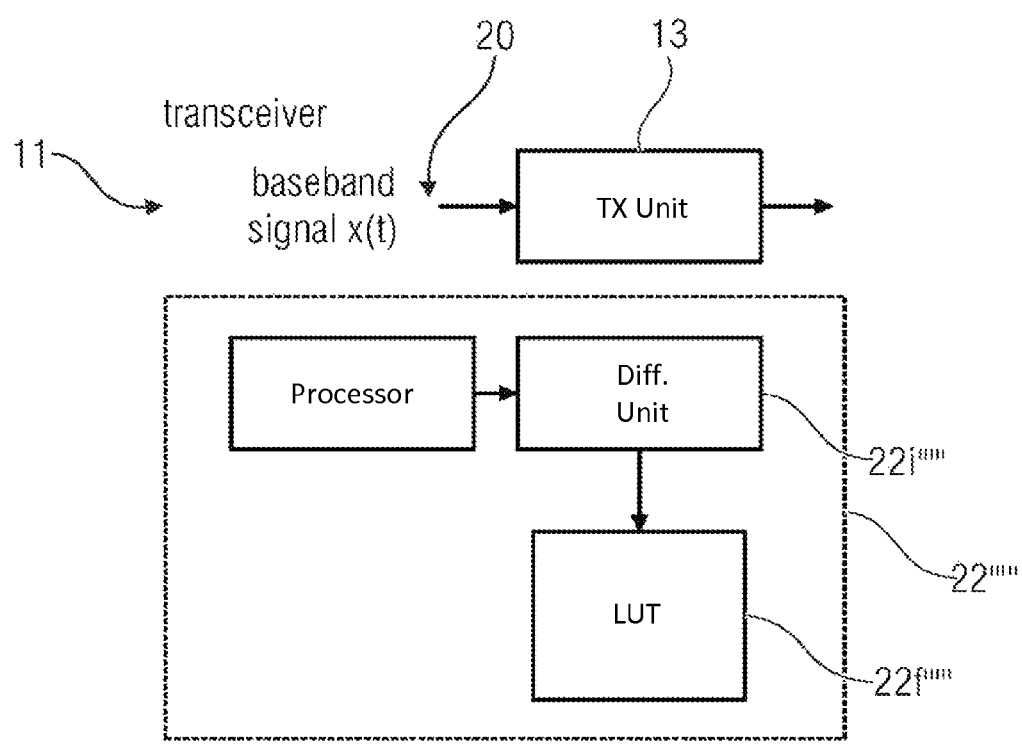

FIG. 6D shows a part view of an implementation of the controller 18'''' which is arranged parallel to the transmit unit 13. The controller 18'''' substantially complies with the controller 18'''' of FIG. 6C, wherein the differentiator 18*i''''* is formed as a software implemented algorithm, i.e. for example by a processor or CPU, which is configured to execute the software algorithm and to calculate the derivative of the AM/AM-distortion. As discussed with respect to FIG. 6C, the result of the calculation may be stored in the lookup table 18*f''''*. Here, it should be noted that the result may be stored as transformed AM/AM-function or as transformed AM/AM-function parameters.

Figure 6E:
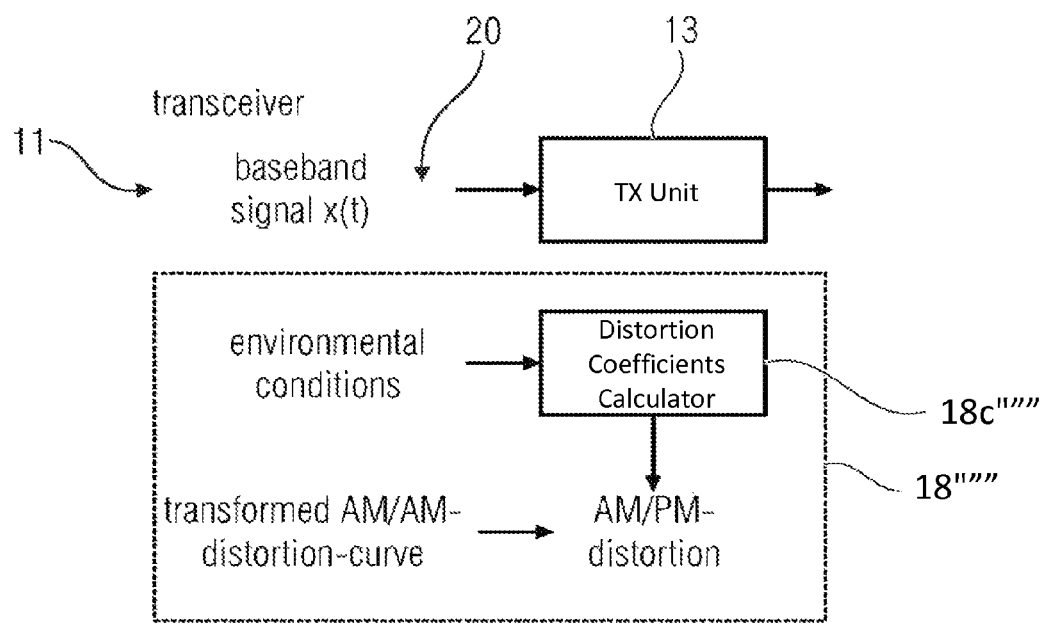
Figure 6F:
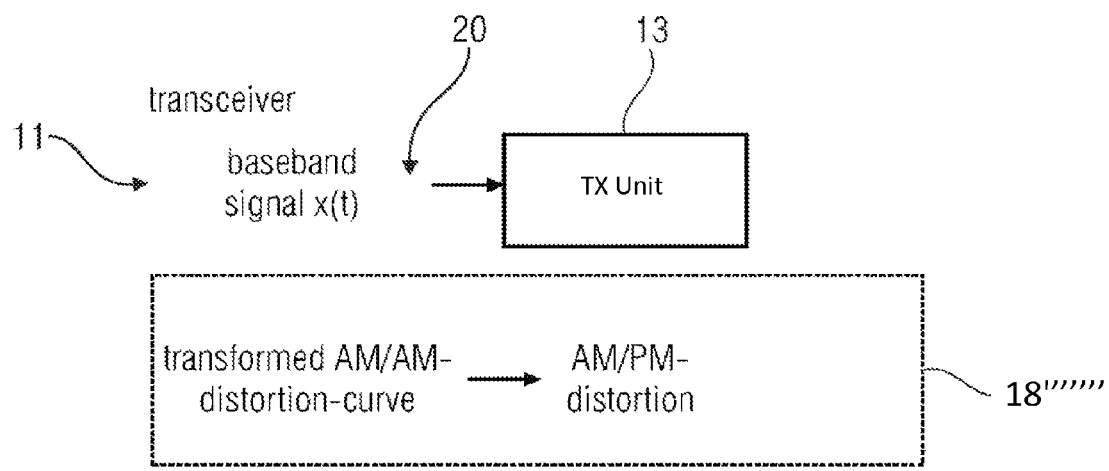

With respect to FIGS. 6E and 6F, different implementations of the controller, especially with focus on the determination of the AM/PM-distortion curve will be discussed. FIG. 6*e* shows a part view of a controller 18''''' for controlling the transmit chain 11. The controller 18''''' comprises the unit 18*c'''''* for determining the AM/PM-distortion coefficients. The coefficients τ, r, t, k and optionally q are determined with respect to the environmental conditions evaluated by using the units of the controller 18'' of FIG. 6A or of the controller 18''' of FIG. 6B. The determination process can be conducted using a lookup table with predefined relationships or by closed mathematical expressions. The relationships between the environmental conditions and the coefficients are to be evaluated by an experimental lab measurement setup in advance. The application of the coefficients to the results of the transformation of the AM/AM-distortion curve (cf. FIGS. 6C and 6D) leads to the closed-form mathematical expression of the AM/PM-distortion curve.

This AM/PM-distortion curve may be stored as a function or as function parameters if the AM/AM-distortion curve features the property that its slope is affected by change in environmental conditions in a manner that keeps the coefficients of the AM/PM-model always constant, than these coefficients may be derived directly from the result of the transformation of the AM/AM-distortion (cf. FIGS. 6C and 6D). This is illustrated by FIG. 6F. FIG. 6F shows the transmit chain 11 and a controller 18'''''' configured to perform the direct transformation of the closed-form mathematical expression of the AM/PM-distortion curve.

In general, it should be noted that generating AM/PM-distortions may also mean simulating AM/PM-distortions (i.e. generating=simulating).

It is clear for a person skilled in the art that the different implementations shown above or shown especially with respect to FIGS. 6A to 6F may be arbitrarily combined.

Although some aspects have been described in the context of an apparatus, it is clear that these aspects also represent a description of the corresponding method, where a block or device corresponds to a method act or a feature of a method act. Analogously, aspects described in the context of a method step also represent a description of a corresponding block or item or feature of a corresponding apparatus. Some or all of the method acts may be executed by (or use) a hardware apparatus, like for example, a microprocessor, a programmable computer or an electronic circuit. In some implementations, some one or more of the most important method steps may be executed by such an apparatus.

Depending on certain implementation requirements, implementations may be implemented in hardware or in software. Implementations can be performed using a digital storage medium, for example a floppy disk, a DVD, a Blu-ray, a ROM, a PROM, an EPROM, an EEPROM or a flash memory, having electrically readable control signals stored thereon, which cooperate (or are capable of cooperating) with a programmable computer system such that the respective method is performed. Therefore, the digital storage medium may be computable.

Generally, implementations of the present disclosure can be implemented as computer program product with a program code, the program code being operative for performing one of the methods when the computer program product runs on a computer. The program code may for example be stored on a machine readable carrier. Other implementations comprise the computer program for performing one of the methods described herein, stored on a machine readable carrier. A further implementation of the inventive methods is therefore a data carrier or a digital storage medium comprising, recorded thereon, a computer program for performing one of the methods described herein. The data carrier, the digital storage medium or the recorded medium are typically tangible and/or non-transitory.

A further implementation comprises a processing means, for example a computer or a programmable logic device configured to adapt to perform one of the methods described herein. A further implementation comprises a computer having installed thereon a computer program for performing one of the methods described herein.

In some implementations a programmable logic device (for example a field programmable gate array) may be used to perform some or all of the functionalities of the methods described herein. In some implementations, a field programmable gate array may cooperate with a microprocessor in order to perform one of the methods described herein. Generally, the methods are performed by any hardware apparatus.

The above described implementations are merely illustrative of the present disclosure. It is understood that modifications and variations of the arrangements and the details described herein will be apparent to other skilled in the art. It is the intent, therefore, to be limited only by the scope of the appended patent claims and not by the specific details present by way of description and explanation of the implementations herein.

The invention claimed is:

1. A controller for controlling a signal processor, comprising:
a transformation unit configured to generate at least one amplitude-modulation-to-phase-modulation-distortion within a signal, using the signal processor according to a signal processing, based on the at least one generated amplitude-modulation-to-amplitude-modulation-distortion of the signal; and
a control unit configured to adjust the signal processing of the signal processor to minimize the at least one amplitude-modulation-to-phase-modulation-distortion,
wherein the generation of the at least one amplitude-modulation-to-phase-modulation-distortion is based on a known relationship between a first function describing the at least one amplitude-modulation-to-amplitude-modulation-distortion and a second function describing the at least one amplitude-modulation-to-phase-modulation-distortion,
wherein the generation is based on a known relationship between a first derivative of the first function and the second function.

2. The controller according to claim 1, wherein the first function describes the at least one amplitude-modulation-to-amplitude-modulation-distortion as a relationship between $A_{in}$ to $A_{out}$,
where $A_{in}$ is an amplitude of an input signal and where $A_{out}$ is an amplitude of an output signal, and
wherein the second function describes the at least one amplitude-modulation-to-phase-modulation-distortion as a relationship of $A_{in}$ and $\Delta\phi$,
where $\Delta\phi$ is a phase difference between the input and the output signal.

3. The controller according to claim 1, wherein the control unit is configured to adjust the signal processing based on a model describing the relationship between the first function, the second function, and at least one correction signal to be output to the signal processor.

4. The controller according to claim 1, wherein the relationship between the at least one amplitude-modulation-to-amplitude-modulation-distortion and the at least one amplitude-modulation-to-phase-modulation-distortion depends on an environmental condition.

5. The controller according to claim 4, wherein the environmental condition is temperature, frequency, load impedance or one or more parameters describing the signal processor or a combination thereof.

6. The controller according to claim 1, wherein the relationship between the first function and the second function depends on an environmental condition, and wherein the relationship is described by a set of coefficients, and
wherein the transformation unit is configured to select a set of coefficients from a plurality of sets of coefficients, based on a current environmental condition.

7. The controller according to claim 6, wherein the plurality of sets of coefficients are stored within a lookup table, allocating a respective set of coefficients and respective environmental conditions.

8. The controller according to claim 6, wherein each coefficient of the set of coefficients is calculable based on respective environmental conditions.

9. The controller according to claim 4, wherein the controller comprises a sensor for determining the one or more current environmental conditions.

10. The controller according to claim 1, wherein the controller comprises an amplitude-modulation-to-amplitude-modulation-distortion calculator configured to generate the at least one amplitude-modulation-to-amplitude-modulation-distortion based on current environmental conditions.

11. The controller according to claim 1, wherein the controller comprises an amplitude-modulation-to-amplitude-modulation-distortion detector coupled to the signal processor and configured to measure the at least one amplitude-modulation-to-amplitude-modulation-distortion at the signal processor.

12. The controller according to claim 11, wherein the amplitude-modulation-to-amplitude-modulation-distortion detector is configured to perform a down-converting of the signal output by the signal processor.

13. The controller according to claim 11, wherein the amplitude-modulation-to-amplitude-modulation-distortion detector comprises a coupler unit or a divider unit coupled to the signal processor and configured to receive the signal output by the signal processor.

14. The controller according to claim 1, wherein the signal processor comprises a digital pre-distortion unit, an envelope tracking unit, an adaptive biasing unit for a power amplifier and/or a power amplifier.

15. The controller according to claim 1, wherein the at least one amplitude-modulation-to-amplitude-modulation-distortion is based on a relationship between the at least one amplitude-modulation-to-amplitude-modulation-distortion and a measurable gain characteristic of a power amplifier of the signal processor.

16. The controller according to claim 15, wherein the relationship is approximated by the following formula:

$$A_{out}(A_{in}) = \begin{cases} vA_{in}, & A_{in} < A_{tr}, \\ \dfrac{v(A_{in} - A_{tr})e^{w(A_{in}-A_{tr})}}{\left(1 + \left(\dfrac{v(A_{in} - A_{tr})e^{w(A_{in}-A_{tr})}}{A_0 - vA_{tr}}\right)^{2p}\right)^{1/2p}} + vA\_tr, & A_{in} \geq A_{tr}, \end{cases}$$

where $$P_{in} = 10\text{dB}\log\left(\frac{A_{in}^2}{50 \cdot 1e^{-3}}\right),$$

and $$\text{Gain} = 20\text{dB}\log\left(\frac{A_{out}}{A_{in}}\right),$$

and
where $A_{in}$ is an input amplitude, v a small signal gain, $A_0$ limiting output amplitude, w a gain expansion factor, p a knee factor and $A_{tr}$ a transition amplitude describing the transition between a first region and a second region of the gain characteristic.

17. The controller according to claim 15, wherein the controller comprises an amplitude-modulation-to-amplitude-modulation-distortion detector coupled to the power amplifier and configured to measure the gain characteristic and to calculate the at least one amplitude-modulation-to-amplitude-modulation-distortion based on the measured gain characteristic.

18. A controller for controlling a signal processor, comprising:
a transformation unit configured to generate at least one amplitude-modulation-to-phase-modulation-distortion within a signal, using the signal processor according to a signal processing, based on the at least one generated amplitude-modulation-to-amplitude-modulation-distortion of the signal; and
a control unit configured to adjust the signal processing of the signal processor to minimize the at least one amplitude-modulation-to-phase-modulation-distortion,
wherein the generation of the at least one amplitude-modulation-to-phase-modulation-distortion is based on a known relationship between a first function describing the at least one amplitude-modulation-to-amplitude-modulation-distortion and a second function describing the at least one amplitude-modulation-to-phase-modulation-distortion,
wherein the relationship between the first function and the second function depends on an environmental condition, and wherein the relationship is described by a set of coefficients,
wherein the transformation unit is configured to select the set of coefficients from a plurality of sets of coefficients, based on a current environmental condition, and
wherein the set of coefficients comprising three or more coefficients out of a group comprising r, τ, t, k and/or q, where $$r = \frac{d\gamma(A_{in})}{dA_{in}}\bigg|_{A_{in}=0},$$

where $Y(A_{in})$ is the second function,
where $$\tau = \frac{d\gamma(A_{in})}{dA_{in}}\bigg|_{A_{in}\to\infty},$$

where $$t+k=\gamma(A_{in})|_{A_{in}=0}$$

and where q is an additional fitting parameter.

19. The controller according to claim 18, wherein the relationship between the first and the second function is approximated by the following formula:

$$\gamma(A_{in}) = \frac{dg(A_{in})}{dA_{in}}((r-\tau)A_{in} + k) + \tau A_{in} + t$$

where $g(A_{in})$ is the first function that describes the at least one amplitude-modulation-to-amplitude-modulation distortion as a relationship between $A_{in}$ to $A_{out}$.

20. The controller according to claim 18, wherein the relationship between the first and the second function is approximated by the following formula:

$$\gamma(A_{in}) = \frac{dg(A_{in})}{dA_{in}}((r-\tau)A_{in} + k) + \tau A_{in} + t + qA_{in}^2.$$

21. A controller for controlling a signal processor, comprising:
a transformation unit configured to generate at least one amplitude-modulation-to-phase-modulation-distortion within a signal, output by using the signal processor according to a signal processing, based on at least one generated amplitude-modulation-to-amplitude-modulation-distortion of the signal;
a control unit configured to adjust the signal processing of the signal processor so as to minimize the at least one amplitude-modulation-to-phase-modulation-distortion; and at least a sensor for determining one or more current environmental conditions, wherein the generation of the at least one amplitude-modulation-to-phase-modulation-distortion is based on a relationship between a first function describing the at least one amplitude-modulation-to-amplitude-modulation-distortion as a relationship between $A_{in}$ to $A_{out}$, where $A_{in}$ is the amplitude of an input signal and where $A_{out}$ is an amplitude of an output signal, and a second function describing the at least one amplitude-modulation-to-phase-modulation-distortion as a relationship of $A_{in}$ and $\Delta\phi$, where $\Delta\phi$ is a phase difference between an input and an output signal, wherein the relationship between the first function and the second function depends on environmental conditions, and wherein the relationship is described by a set of coefficients comprising three or more coefficients out of a group comprising r, τ, t, k and/or q, and wherein the transformation unit is configured to elect a set of coefficients out of a group, comprising a plurality of sets of coefficients, dependent on current environmental conditions, where $$r = \frac{d\gamma(A_{in})}{dA_{in}}\bigg|_{A_{in}=0},$$

where $Y(A_{in})$ is the second function,
where $$\tau = \frac{d\gamma(A_{in})}{dA_{in}}\bigg|_{A_{in}\to\infty}$$

where $$t + k = \gamma(A_{in}) \mid A_{in} = 0$$

and where q is an additional fitting parameter, wherein the relationship between the first and the second function is approximated by the following formula:

$$\gamma(A_{in}) = \frac{dg(A_{in})}{dA_{in}}((r-\tau)A_{in} + k) + \tau A_{in} + t,$$

where $g(A_{in})$ is the first function that describes the at least one amplitude-modulation-to-amplitude-modulation distortion as a relationship between $A_{in}$ to $A_{out}$.

22. A controller for controlling a signal processor, comprising:
a transformation unit configured to generate at least one amplitude-modulation-to-phase-modulation-distortion within a signal, using the signal processor according to a signal processing, based on at least one generated amplitude-modulation-to-amplitude-modulation-distortion of the signal;
a control unit configured to adjust the signal processing of the signal processor so as to minimize the at least one amplitude-modulation-to-phase-modulation-distortion; and
an amplitude-modulation-to-amplitude-modulation-distortion calculator configured to generate the at least one amplitude-modulation-to-amplitude-modulation-distortion based on current environmental conditions, or an amplitude-modulation-to-amplitude-modulation-distortion detector coupled to the signal processor and configured to measure the amplitude-modulation-to-amplitude-modulation-distortion at the signal processor, wherein the generation of the at least one amplitude-modulation-to-phase-modulation-distortion is based on a relationship between a first function describing the at least one amplitude-modulation-to-amplitude-modulation-distortion as a relationship between to $A_{out}$, where $A_{in}$ is an amplitude of an input signal and where $A_{out}$ is an amplitude of an output signal, and a second function describing the at least one amplitude-modulation-to-phase-modulation-distortion as a relationship of $A_{in}$ and $\Delta\phi$, where $\Delta\phi$ is a phase difference between the input and the output signal, wherein the generation of the at least one amplitude-modulation-to-phase-modulation-distortion is based on a relationship between the first derivative of the first function and the second function.

23. A computer readable digital non-transitory storage medium having stored thereon a computer program having a program code for performing, when running on a computer, a method for controlling a signal processor, comprising:
generating at least one amplitude-modulation-to-phase-modulation-distortion within a signal, output by using the signal processor according to a signal processing, based on at least one generated amplitude-modulation-to-amplitude-modulation-distortion of the signal; and
adjusting the signal processing of the signal processor so as to minimize the at least one amplitude-modulation-to-phase-modulation-distortion,
wherein the generation of the at least one amplitude-modulation-to-phase-modulation-distortion is based on a known relationship between a first function describing the at least one amplitude-modulation-to-amplitude-modulation-distortion and a second function describing the at least one amplitude-modulation-to-phase-modulation-distortion,
wherein the generation of the at least one amplitude-modulation-to-phase-modulation-distortion is based on a relationship between the first derivative of the first function and the second function,
wherein the control unit is configured to adjust the signal processing based on a model describing the relationship between the first function, the second function, and at least one correction signal to be output to the signal processor.

24. A mobile communication device comprising a controller for controlling a signal processor, comprising:
a transformation unit configured to generate at least one amplitude-modulation-to-phase-modulation-distortion within a signal, output by using the signal processor according to a signal processing, based on generated at least one amplitude-modulation-to-amplitude-modulation-distortion of the signal; and
a control unit configured to adjust the signal processing of the signal processor so as to minimize the at least one amplitude-modulation-to-phase-modulation-distortion,
wherein the generation of the at least one amplitude-modulation-to-phase-modulation-distortion is based on a known relationship between a first function describing the at least one amplitude-modulation-to-amplitude-modulation-distortion and a second function describing the at least one amplitude-modulation-to-phase-modulation-distortion,
wherein the generation of the at least one amplitude-modulation-to-phase-modulation-distortion is based on a relationship between the first derivative of the first function and the second function, wherein the relationship between the first function and the second function depends on an environmental condition, and wherein the relationship is described by a set of coefficients, wherein the transformation unit is configured to select the set of coefficients from a plurality of sets of coefficients, based on a current environmental condition, and wherein the set of coefficients comprising three or more coefficients out of a group comprising r, τ, t, k and/or q, where $$r = \frac{d\gamma(A_{in})}{dA_{in}}\bigg|_{A_{in}=0},$$

where $Y(A_{in})$ is the second function,
where $$\tau = \frac{d\gamma(A_{in})}{dA_{in}}\bigg|_{A_{in}\to\infty},$$

where $t+k=\gamma(A_{in})|A_{in}=0$ and where q is an additional fitting parameter.

* * * * *